United States Patent
Mukaida et al.

(10) Patent No.: US 10,418,538 B2
(45) Date of Patent: Sep. 17, 2019

(54) THERMOELECTRIC MATERIAL AND THERMOELECTRIC MODULE

(71) Applicant: National Institute of Advanced Industrial Science and Technology, Tokyo (JP)

(72) Inventors: Masakazu Mukaida, Tsukuba (JP); Qingshuo Wei, Tsukuba (JP); Takao Ishida, Tsukuba (JP); Yasuhisa Naitoh, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 215 days.

(21) Appl. No.: 15/440,511

(22) Filed: Feb. 23, 2017

(65) Prior Publication Data

US 2017/0162777 A1 Jun. 8, 2017

Related U.S. Application Data

(62) Division of application No. 14/424,309, filed as application No. PCT/JP2013/068184 on Jul. 2, 2013, now abandoned.

(60) Provisional application No. 61/695,026, filed on Aug. 30, 2012.

(51) Int. Cl.
*H01L 35/34* (2006.01)
*H01L 35/24* (2006.01)
*H01L 35/02* (2006.01)

(52) U.S. Cl.
CPC .............. *H01L 35/34* (2013.01); *H01L 35/24* (2013.01); *H01L 35/02* (2013.01)

(58) Field of Classification Search
CPC .......... H01L 35/02; H01L 35/24; H01L 35/34
See application file for complete search history.

(56) References Cited

U.S. PATENT DOCUMENTS

| 2005/0178424 A1 | 8/2005 | Yotsuhashi et al. |
| 2006/0151021 A1 | 7/2006 | Stark |
| 2010/0170551 A1 | 7/2010 | Hiroyama et al. |
| 2010/0212713 A1 | 8/2010 | Sasaki et al. |

FOREIGN PATENT DOCUMENTS

| JP | 2002-232028 A | 8/2002 |
| JP | 2006-319119 A | 11/2006 |
| JP | 2012-084821 A | 4/2012 |

(Continued)

OTHER PUBLICATIONS

International Search Report for International Application No. PCT/JP2013/068184, dated Sep. 17, 2013, in 2 pages.

(Continued)

*Primary Examiner* — Edward J. Schmiedel
(74) *Attorney, Agent, or Firm* — Knobbe, Martens, Olson & Bear, LLP

(57) ABSTRACT

A thermoelectric material is manufactured by a manufacturing process including annealing at an annealing temperature from 125° C. to 200° C. and for an annealing time from 5 minutes to 12 hours applied to a substance selected from the group consisting of conductive polymer, polystyrene sulfonate (PSS), tosylate (TOS), chloride and perchlorate and a substance as solvent selected from the group consisting of ethylene glycol, ethanol, dimethyl sulfoxide and isopropanol.

9 Claims, 36 Drawing Sheets

(56) References Cited

FOREIGN PATENT DOCUMENTS

WO    WO 2005/047560 A1    5/2005
WO    WO 2009/063911 A1    5/2009

OTHER PUBLICATIONS

International Preliminary Report on Patentability and Written Opinion of the International Searching Authority for International Application No. PCT/JP2013/068184, dated Mar. 3, 2015, in 7 pages.
Extended European Search Report issued in corresponding European Patent Application No. 13833465.1, dated Mar. 21, 2016.
Office Action issued in Japanese Patent Application No. 2014-532858 dated Nov. 24, 2015.
Bubnova et al., "Optimization of the thermoelectric figure of merit in the conducting polymer poly(3,4-ethylenedioxythiophene)," *Nature Materials*, vol. 10, pp. 429-433 (Jun. 2011).
Ethylene Glycol Product Guide; MEGlobal; 2008; http://www.meglobal.biz/media/product_guides/MEGlobal_MEG.pdf; pp. 1-33.
F.-X. Jiang, J.-K. Xu, B.-Y. Lu, Y. Xie, R.-J. Huang and L.-F. Li; Thermoelectric Performance of Poly(3,4-ethylenedioxythiophene):Poly(styrenesulfonate); Chin. Phys. Lett., 2008, 25, 2202; http://iopscience.iop.org/article/10.1088/0256-307X/25/6/076/pdf.

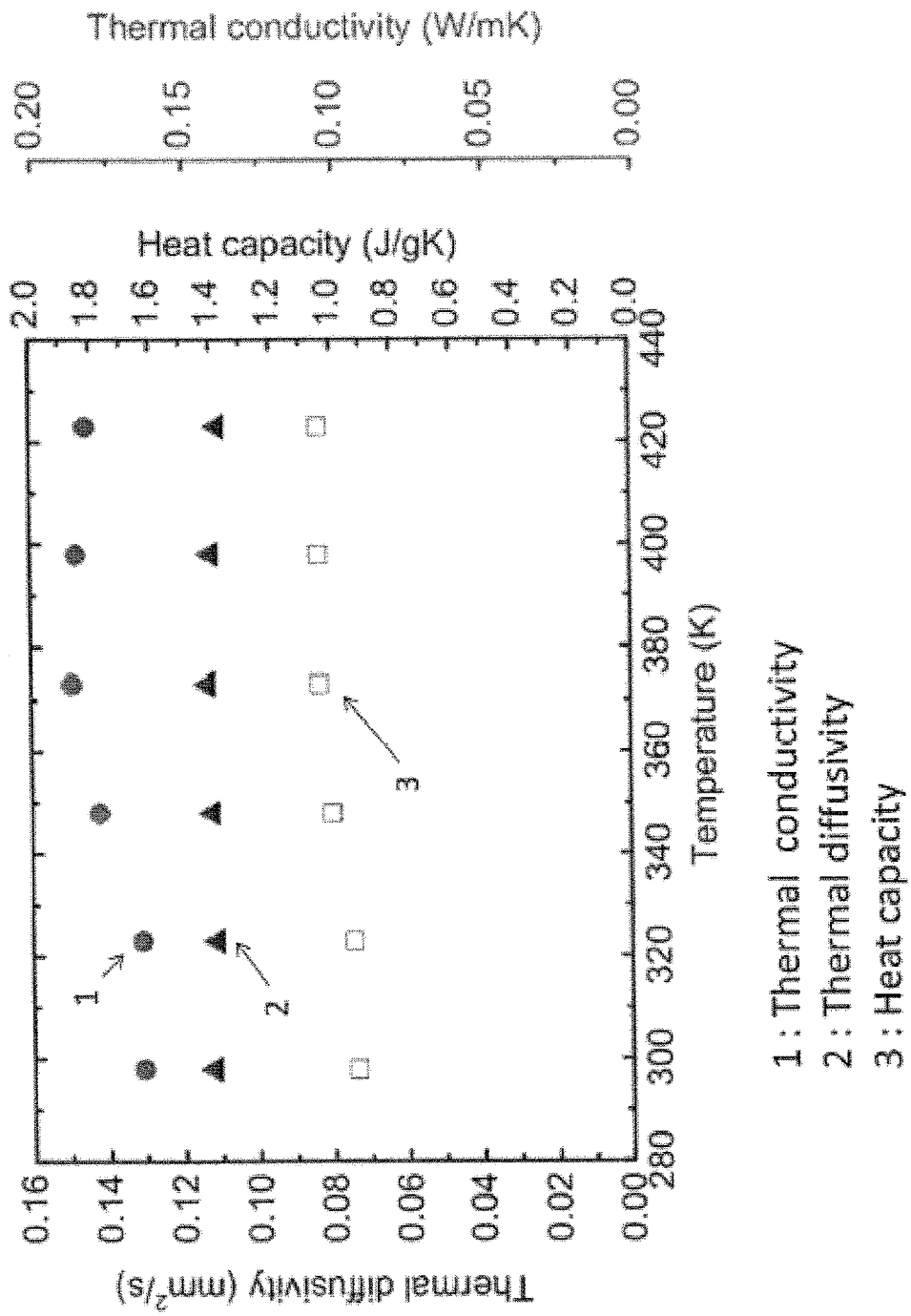

$q$ (Å⁻¹)

1: RELATIVE HUMIDITY 30%
2: RELATIVE HUMIDITY 50%

1: RELATIVE HUMIDITY 30%
2: RELATIVE HUMIDITY 50%

FIG. 14C

| T (K) | RH (%) | WVC (g/m³) | S (μV/K) | σ (S/cm) | κ (W/mK) | ZT |
|---|---|---|---|---|---|---|
| 303 | 30 | 9.114 | 14.0 | 800 | 0.18 | 0.026 |
| 303 | 50 | 15.19 | 33.1 | 800 | 0.18 | 0.148 |
| 313 | 30 | 15.34 | 15.6 | 800 | 0.18 | 0.034 |
| 313 | 50 | 25.56 | 48.4 | 800 | 0.18 | 0.326 |

(1)

(2)

(3)

(a) ELEMENT IN WHICH ORGANIC THERMOELECTRIC MATERIALS ARE CONNECTED IN SERIES (b) ELEMENT IN WHICH ORGANIC THERMOELECTRIC MATERIALS ARE CONNECTED IN PARALLEL

THERMOELECTRIC MATERIAL AND THERMOELECTRIC MODULE

CROSS-REFERENCE TO RELATED APPLICATIONS

This application is a divisional of U.S. application Ser. No. 14/424,309, filed Feb. 26, 2015 which is the U.S. National Phase under 35 U.S.C. § 371 of International Application PCT/JP2013/068184, filed Jul. 2, 2013, which claims priority to U.S. Provisional Application No. 61/695,026, filed Aug. 30, 2012.

TECHNICAL FIELD

The embodiments described herein are related to an energy conservation technology field, especially to a field in which waste heat from thermoelectric materials is converted to electricity using organic semiconductors.

BACKGROUND ART

A thermoelectric element (thermoelectric device) is an element in which both ends of two different types of metal or semiconductors are joined together and the temperature differences caused at the both ends are used to develop electromotive force, that is, Seebeck effect is used to convert thermal energy to electric energy. When a semiconductor is used to manufacture a thermoelectric element, a p-type semiconductor and an n-type semiconductor are combined. Organic materials are used as thermoelectric materials to manufacture a thermoelectric element. In conventional thermoelectric property characterizations of organic materials, TOS (para-toluenesulfonic acid ester) is used as dopant to PEDOT (Poly(3,4-ethylenedioxythiophene)).

Related techniques are described in the following non-patent document 1.

CITATION LIST

Non-Patent Document

[Non-patent document 1] Bubnova, O.; Khan, Z. U.; Malti, A.; Braun, S.; Fahlman, M.; Berggren, M.; Crispin, X., Nat. Mater. 2011, 10, 429-433.

SUMMARY

Problems to be Solved

Although the characteristics of TOS is that the composition control of TOS can be relatively easily achieved, the material itself is unstable and it cannot be easily achieved to eliminate metal ion which deteriorates the characteristics. Therefore, TOS is not applicable to the practical manufacturing of the thermoelectric element.

In addition, Bi—Te system materials should be used as non-organic materials in consideration of waste heat recovery when the temperature of the waste heat of the thermoelectric materials is lower than 200° C. In this case, the fact that the manufacturing cost increases because the materials are rare metal and the materials have toxic properties should be concerned. Further, since the materials are scarce elements and hard, namely fragile, use of large amounts of the materials is costly and maximizing the surface area of the thermoelectric elements will be difficult.

According to the present invention, it is an object to provide an organic thermoelectric material and a thermoelectric module which is manufactured with stable materials, the cost of which can decrease and for which the production process can be easily established.

SUMMARY OF THE INVENTION

Means of Solving the Problems

In order to solve the above problems, a thermoelectric material disclosed herein is prepared by a manufacturing process including annealing at an annealing temperature from 125° C. to 200° C. and for an annealing time from 5 minutes to 12 hours applied to a material which includes conductive polymer, a substance selected from the group consisting of polystyrene sulfonate (PSS), tosylate (TOS), chloride and perchlorate and a substance as solvent selected from the group consisting of ethylene glycol, ethanol, dimethyl sulfoxide and isopropanol. With the annealing process employed, a thermoelectric material having a preferable crystal orientation can be manufactured without a complicated process.

In addition, the conductive polymer is Poly(3,4-ethylenedioxythiophene) (PEDOT). Further, the solvent is ethylene glycol with the additive amount of equal to or more than 3% by weight. Moreover, the annealing temperature is about 150° C. And the annealing time is at least equal to more than 30 minutes.

Additionally, the manufacturing process includes a process of making the material contain water in the embodiments. In addition, a process of sealing the material is performed after the process of making the material contain water in the embodiments. As a result, a high figure of merit of the thermoelectric material manufactured in the embodiments can be achieved while the water evaporation from the thermoelectric material can be preferably inhibited.

Further, a thermoelectric module is manufactured by using a p-type or an n-type of the thermoelectric material in the embodiments. Alternatively, a thermoelectric module is manufactured by combining a p-type and an n-type of the thermoelectric material in the embodiments. As a result, the structure of the thermoelectric material can be flexibly changed to manufacture the thermoelectric module which can achieve a preferable voltage for practical use.

Furthermore, the thermoelectric module is manufactured by connecting a plurality of units in series in which a plurality of elements are connected in parallel, the element being formed by connecting the thermoelectric materials in series. Alternatively, the thermoelectric module is manufactured by connecting a plurality of units in parallel in which a plurality of elements are connected in series, the element being formed by connecting the thermoelectric materials in parallel.

Advantageous Effects of Invention

It has been reported that a thermoelectric material using organic semiconductors has the performance index (ZT) is equal to or lower than 0.1. Aside from this, only a thermoelectric material having a ZT value of 0.25 has been reported. On the other hand, a thermoelectric material using an organic semiconductor with ZT being 0.33 can be obtained according to the present invention. It is noted that ZT should preferably be 1 for practical use. In addition, a thermoelectric material can be formed into a thin material or into any shapes since the thermoelectric material is watersoluble. Further, a thermoelectric material can be formed on an inexpensive flexible sheet such as a paper sheet.

BRIEF DESCRIPTION OF DRAWINGS

FIG. 7 illustrates relations between temperature and thermal conductivity, temperature and thermal diffusivity, and temperature and thermal capacity according to an embodiment;

FIG. 14C illustrates a table of the figure of merit ZT calculated using Seebeck coefficients obtained from the gradients as illustrated by the graphs in FIGS. 14A and 14B, thermal conductivity and electrical conductivity;

DESCRIPTION OF EMBODIMENTS

Embodiments according to the present invention are described below with reference to the drawings. It is to be understood that both the foregoing general description and the following detailed description are exemplary and explanatory and are not restrictive of the invention, as claimed.

A thermoelectric material of which the electrical conductivity is high and the Seebeck coefficient is not decreased can be manufactured by nanostructure control to increase the carrier mobility without increasing the carrier density. In addition, the thermoelectric material can be manufactured on a flexible sheet such as a paper and the thermal electromotive force of 0.5 mV is confirmed by measurement. And the voltage which can be obtained from the arrangement according to an embodiment can be increased by simply increasing the number of materials manufactured on the flexible sheet.

Figure 1:
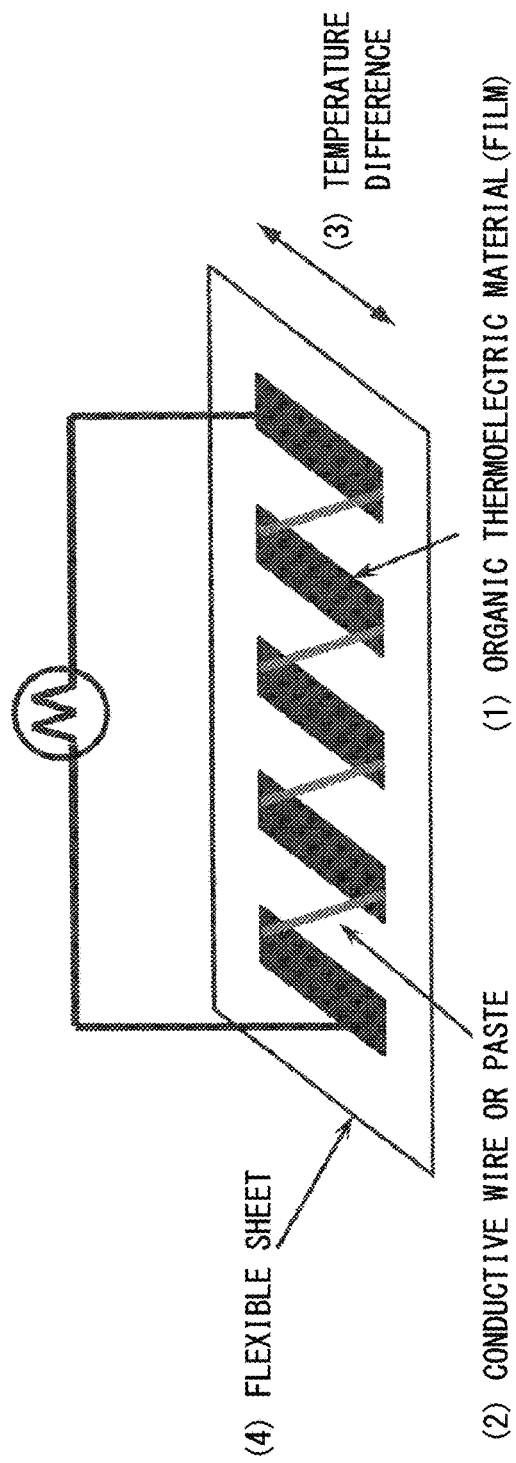
FIG. 1 is a diagram schematically illustrating a thermoelectric element using a thermoelectric material according to an embodiment.

FIG. 1 is a diagram schematically illustrating a thermoelectric element manufactured using a thermoelectric material according to an embodiment. A material with a figure of merit of ZT=0.08 (at room temperature), which is applicable as an organic thermoelectric material, can be obtained in the embodiment by using mainly PEDOT:PSS, which is known as an organic conducting material, and controlling the structure etc. of the material to improve the characteristics as a thermoelectric material.

As illustrated in FIG. 1, the thermoelectric materials according to the present embodiment can be connected in series by conductive wires or conductive paste to increase the amount of electric output due to temperature difference.

Additionally, both the p-type region and the n-type region are not necessarily connected with each other in the thermoelectric material according to the present embodiment.

Since the temperature difference can be obtained along the longitudinal direction of the material and the low thermal conductivity, which is characteristic of organic material, can achieve a temperature difference larger than that of a conventional material, the waste heat can be exploited to the full.

Further, a thin, lightweight and flexible thermoelectric element can be manufactured by instillation of the material onto the flexible sheet or by attachment of a freestanding film onto the flexible sheet. In addition, since the thermoelectric element can be printed on an inexpensive material such as a paper, the thermoelectric element can be manufactured at a cost lower than that of a conventional thermoelectric element.

A thermoelectric material is generally manufactured as a module by connecting the p-type region and the n-type region by a conductive material to increase the voltage. However, a thermoelectric element by which the voltage can be increased can be manufactured in the present embodiment by merely connecting one of the p-type region and the n-type region with a conductive material. This type of manufacturing thermoelectric materials, that is, connecting one of the p-type region and the n-type region with a conductive material, is novel. It is noted that the shape of the organic thermoelectric film and the shape of the conductive material can be arbitrarily designed at the higher temperature side and at the lower temperature side. That is, the shapes can be either a linear profile or a curve profile. In essence, the shapes can be any shape as long as the temperature difference can be achieved. The thermoelectric material can be manufactured to include curve sections. Alternatively, the thermoelectric material can be bent after production. Therefore, the conductive material used in the present embodiment can be any materials as long as the electric conductivity is ensured. That is, the conductive material can be a metal wire and conductive paste etc. Any restrictions are not imposed on the metal component of the conductive material. Therefore, gold, cupper, platinum and silver etc. can be used as the conductive material.

Moreover, any flexible sheet can be used for manufacturing the organic thermoelectric material according to the present embodiment as long as the electrical insulation can be ensured. That is, a paper and a plastic film can be used in the present embodiment. However, a process for providing a hydrophilic property for the surface of the material is performed depending on the type of material when a plastic film is used in the present embodiment, since PEDOT:PSS solution is dropped onto the surface. It is noted that the method of providing a hydrophilic property for the surface of the material can be arbitrarily selected. For example, applying masking to the surface and exposing the surface to ultraviolet light can form a hydroxyl on the surface to provide the surface with a hydrophilic property since oxygen is converted into ozone in the air. With this method, a thermoelectric material can be formed in any shape in the present embodiment.

Working Example 1

We report that highly ordered poly(3,4-ethylenedioxythiophene):poly(styrenesulfonate) (PEDOT:PSS) films displayed a high thermoelectric figure of merit at room temperature. Grazing-incidence wide angle X-ray diffraction (GIWAXD) and grazing-incidence small-angle X-ray scattering (GISAXS) illustrate that adding ethylene glycol (EG) to the PEDOT:PSS solution improved the crystallinity of PEDOT and the ordering of the PEDOT nanocrystals in the solid films. The highly ordered PEDOT:PSS films had an electrical conductivity of 830 S/cm, a Seebeck coefficient of 44 pk/V, and a thermal conductivity of 0.18 W/mK, resulting in a figure of merit of 0.27 at 303 K. Our results suggest that these organic semiconducting materials could be very promising for low-temperature thermoelectric elements.

Thermoelectric elements, which can be used for the direct conversion of heat energy to electricity, have drawn intense interest as promising candidates for harvesting waste heat and solar thermal energy. The most important parameter for evaluating the performance of the thermoelectric materials is the figure of merit (ZT), which is defined as $$ZT = \frac{S^2 \sigma}{k} T$$

where S is the Seebeck coefficient, σ is the electrical conductivity, κ is the thermal conductivity, and T is the temperature. Pioneering studies of thermoelectric materials mainly focused on inorganic semiconductors, such as bismuth-telluride (Bi—Te) alloys, magnesium-silicon (Mg—Si) alloys, and metal oxides. Most of these materials work at temperatures higher than 200° C.; the best known low-temperature thermoelectric material is Bi2Te3, which has a room temperature ZT greater than 1. However, waste heat and solar-thermal energy are usually at temperatures lower than 150° C. The efficiency of thermal power conversion at low temperatures is low because of the small temperature difference. Therefore, to harvest the huge amount of thermal energy available at low temperatures, large-area thermoelectric elements are necessary. However, Te is a rare metal; it is expensive and not environmental friendly, and is thus not suitable for large-area thermoelectric elements.

Unlike their inorganic counterparts, organic semiconductors have not been thoroughly investigated, because of their relatively low electrical conductivity and Seebeck coefficient. Recent advances in organic electronics for elements such as organic solar cells and transistors have improved the physical and chemical properties of organic semiconductors. They can now be tuned over a fairly large range, which may make them suitable for thermoelectric elements. Moreover, organic semiconductors generally have a low intrinsic thermal conductivity, which could produce organic thermoelectric elements with high conversion efficiencies.

Early studies on organic thermoelectrics mainly focused on polyaniline, polypyrrole, and polythiophene. The stable power factor (P=S2σ) for these materials is less than 10 μW/mK2, and ZT is on the order of 10-3. Leclerc et al. have reported that polycarbazole may be a promising candidate for thermoelectric applications, because of its high electrical conductivity and Seebeck coefficient. Hybrid materials, such as conducting polymers and quantum dots, conducting polymers and carbon nanotubes, and metal complexes, have also attracted much attention because they have high Seebeck coefficients and are simple to process. Very recently, Crispin et al. reported that the de-doping of highly conductivity poly(3,4-ethylenedioxythiophene):tosylate (PEDOT:tos) with tetrakis(dimethylamino)ethylene (TDAE) can produce a remarkable ZT value of 0.25, and a power factor greater than 300 μW/mK2, mainly because of the high Seebeck coefficient (>200 pV/K). This indicates that the performance of organic thermoelectrics could approach that of their inorganic counterparts.

Poly(3,4-ethylenedioxythiophene):poly(styrenesulfonate) (PEDOT:PSS) is the most studied conducting polymer system because of its potential use as a transparent electrode. Adding a second solvent, such as ethylene glycol (EG) or dimethyl sulfoxide (DMSO), to an aqueous dispersion of PEDOT:PSS can dramatically enhance its electrical conductivity. Numerous studies have been published on optimizing the process conditions to improve electrical conductivity of PEDOT:PSS, and on understanding the underlying mechanisms. However, there are relatively few studies on the thermoelectric properties of these highly conductive PEDOT:PSS systems. Katz et al. have reported power factors of 47 μW/mK2 for highly conductive PEDOT:PSS, although the Seebeck coefficient decreased significantly as the electrical conductivity increased, and the thermal conductivity is not reported.

Here, we report the thermoelectric properties of commercial Clevios PH1000 PEDOT:PSS with addition of a second solvent, EG. The addition of ethylene glycol significantly increased the electrical conductivity of PEDOT:PSS without decreasing the Seebeck coefficient. The film morphology is examined by grazing-incidence wide angle X-ray diffraction (GIWAXD) and grazing incidence small-angle X-ray scattering (GISAXS) (Bruker D8 discover X-ray diffractometer) in order to explain the results. Free-standing PEDOT:PSS films with addition of different concentrations of EG are prepared, and their thermal properties are examined by using flash analysis and temperature wave analysis methods.

Figure 2A:
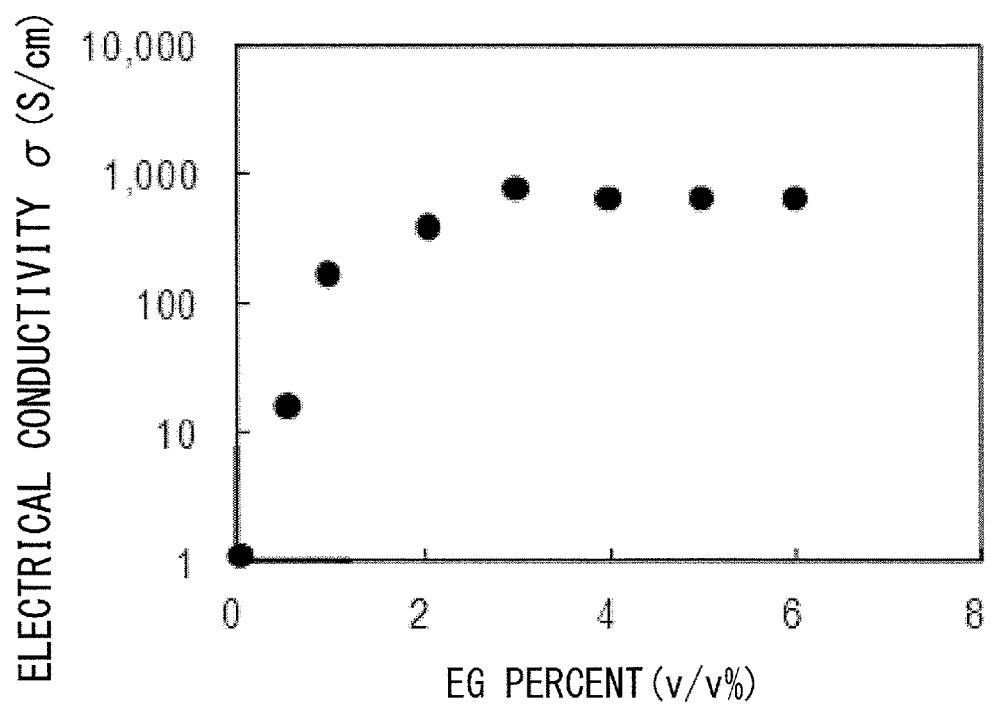
FIG. 2A is a graph of electrical conductivity σ plotted as a function of the amount of EG according to an embodiment.
Figure 2B:
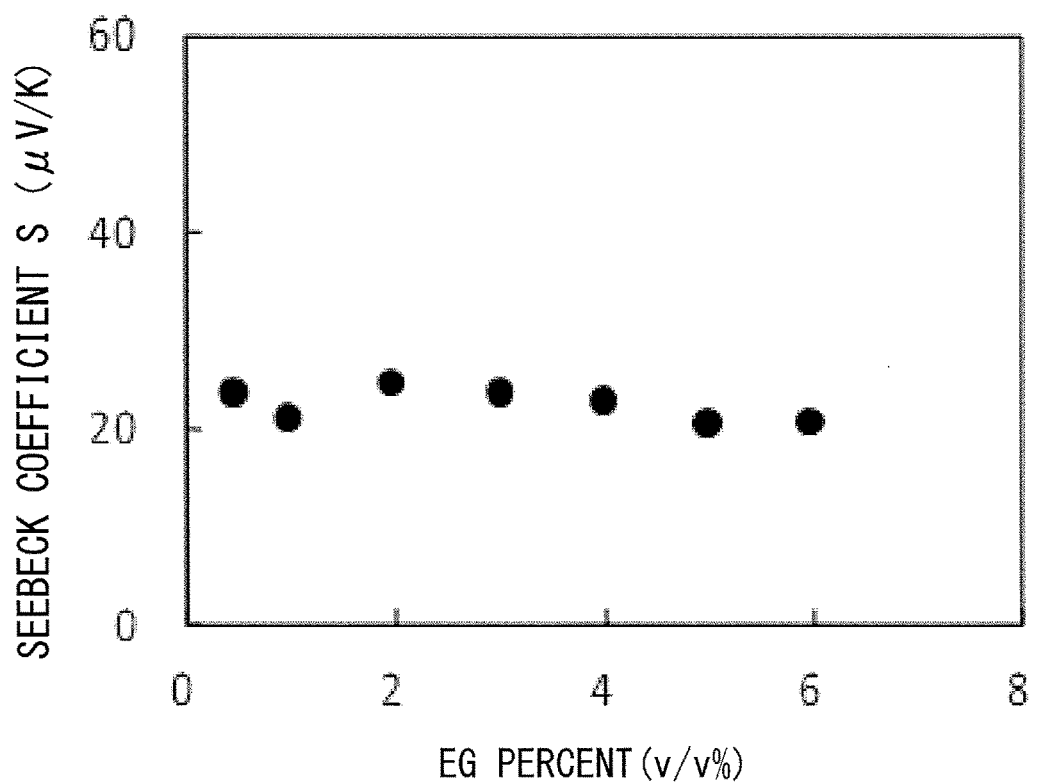
FIG. 2B is a graph of Seebeck coefficient S plotted as a function of the amount of EG according to an embodiment.

All films used to measure the electrical conductivity and Seebeck coefficients are prepared on glass substrates by drop casting. The PEDOT:PSS solution (400 μL) with or without addition of EG is dropped onto a 2×2 cm glass substrate, and the solvent is slowly evaporated over several hours. The film is annealed at 150° C. for 30 min in air. The thickness of the film is measured by using a surface profiler, and is about 8 μm. The slow initial evaporation of the solvent is critical in forming a smooth film. The electrical conductivity is measured by using a conventional four-probe method. FIG. 2A illustrates the electrical conductivity, σ, of the PEDOT:PSS films plotted as a function of the EG concentration in the solution. As the EG concentration increased to 3%, σ increased and then decreased slightly at higher concentrations. These observations are consistent with previous reported results. The Seebeck coefficient is measured for temperature differences between 1 and 8° C. The slopes of the plots of ΔV versus ΔT gave values of S; more than 30 points are used for the curve fitting. FIG. 2B illustrates that the Seebeck coefficient at 303 K is not altered by the amount of EG in the solution. All samples had a Seebeck coefficient value of 24 μV/K. The dependence of the electrical conductivity and the Seebeck coefficient on the EG concentration can be attributed to changes in the film morphology, because EG is only a co-solvent. To understand the effect of EG addition on the film morphology, GIWAXD and GISAXS studies are carried out.

Figure 3A:
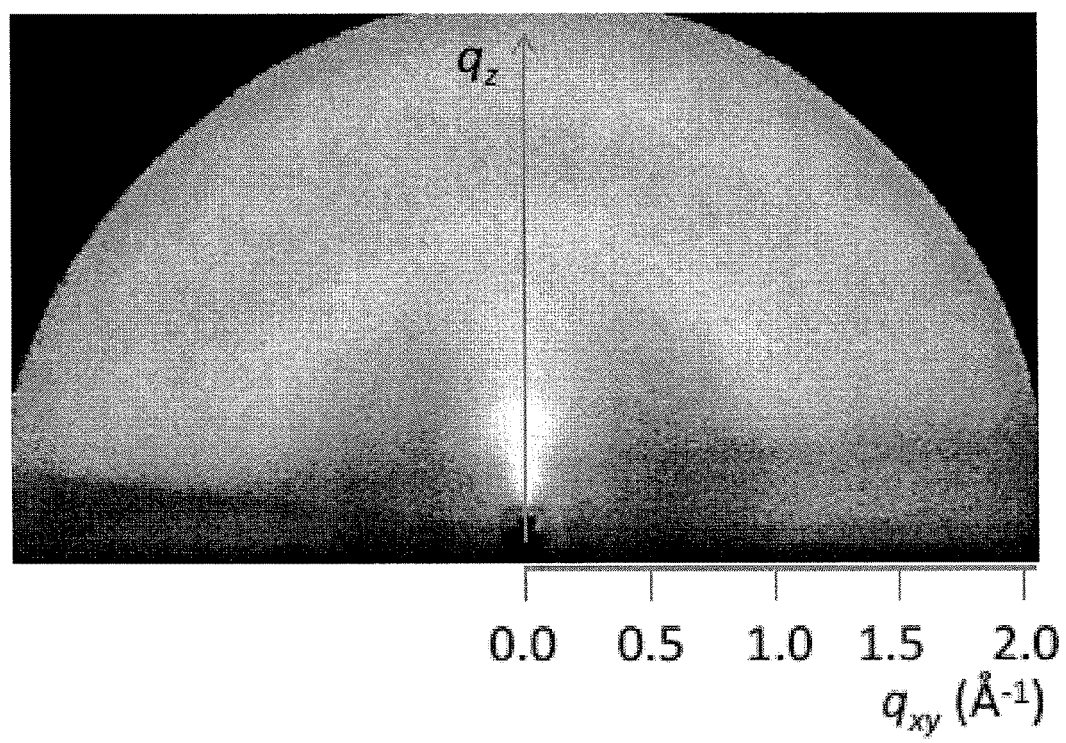
FIG. 3A illustrates a two dimensional GIWAXD pattern of a PEDOT:PSS thin film without addition of EG according to an embodiment.
Figure 3B:
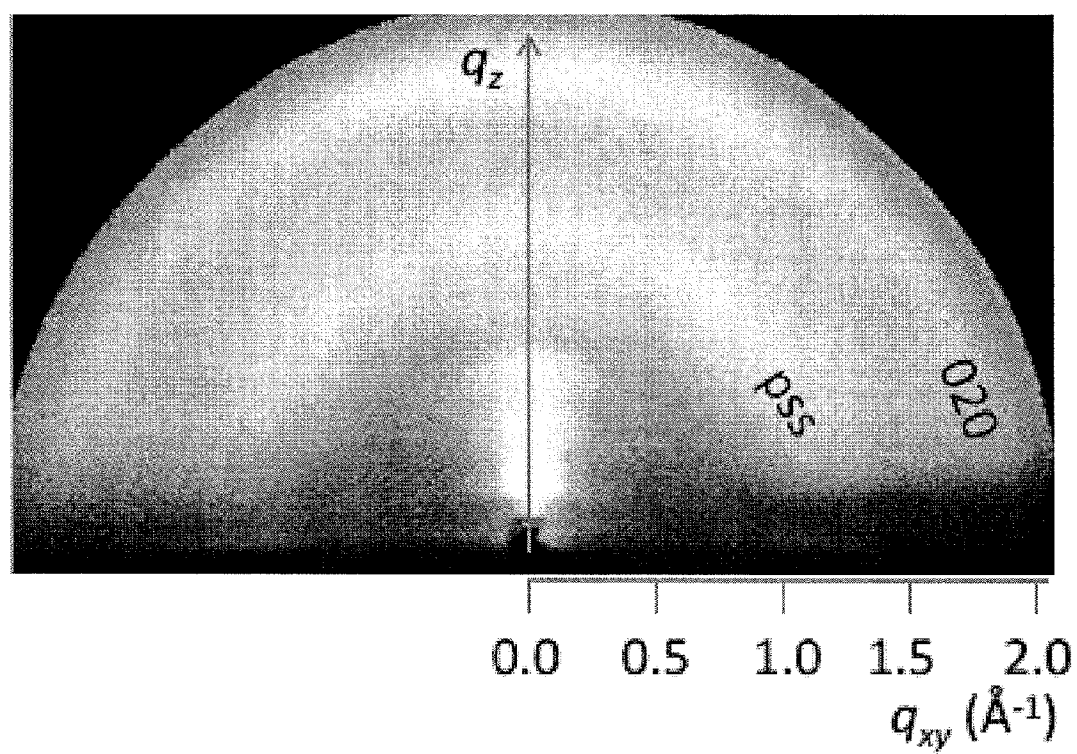
FIG. 3B illustrates a two dimensional GIWAXD pattern of a PEDOT:PSS thin film with addition of 3% EG according to an embodiment.
Figure 8A:
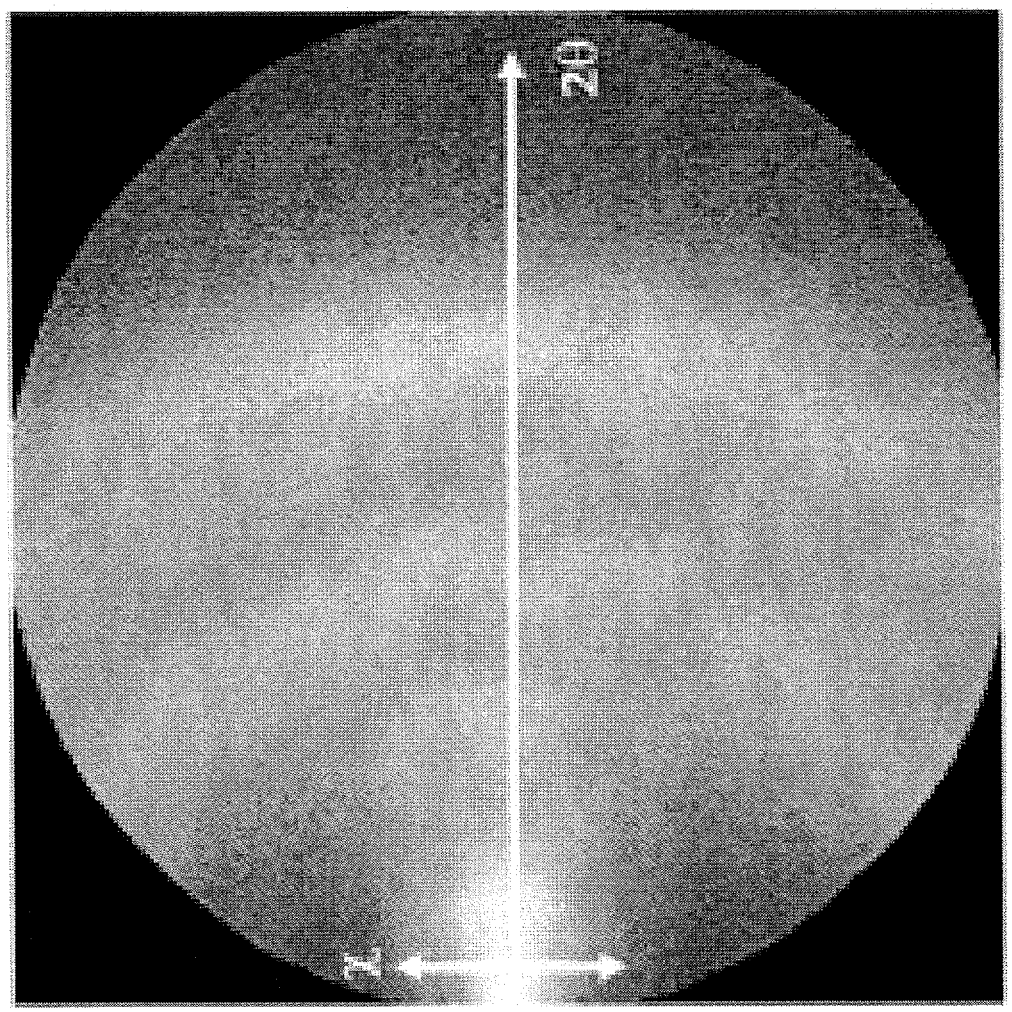
FIG. 8A illustrates a 2D diffraction pattern of a PEDOT:PSS film without addition of EG according to an embodiment.
Figure 8B:
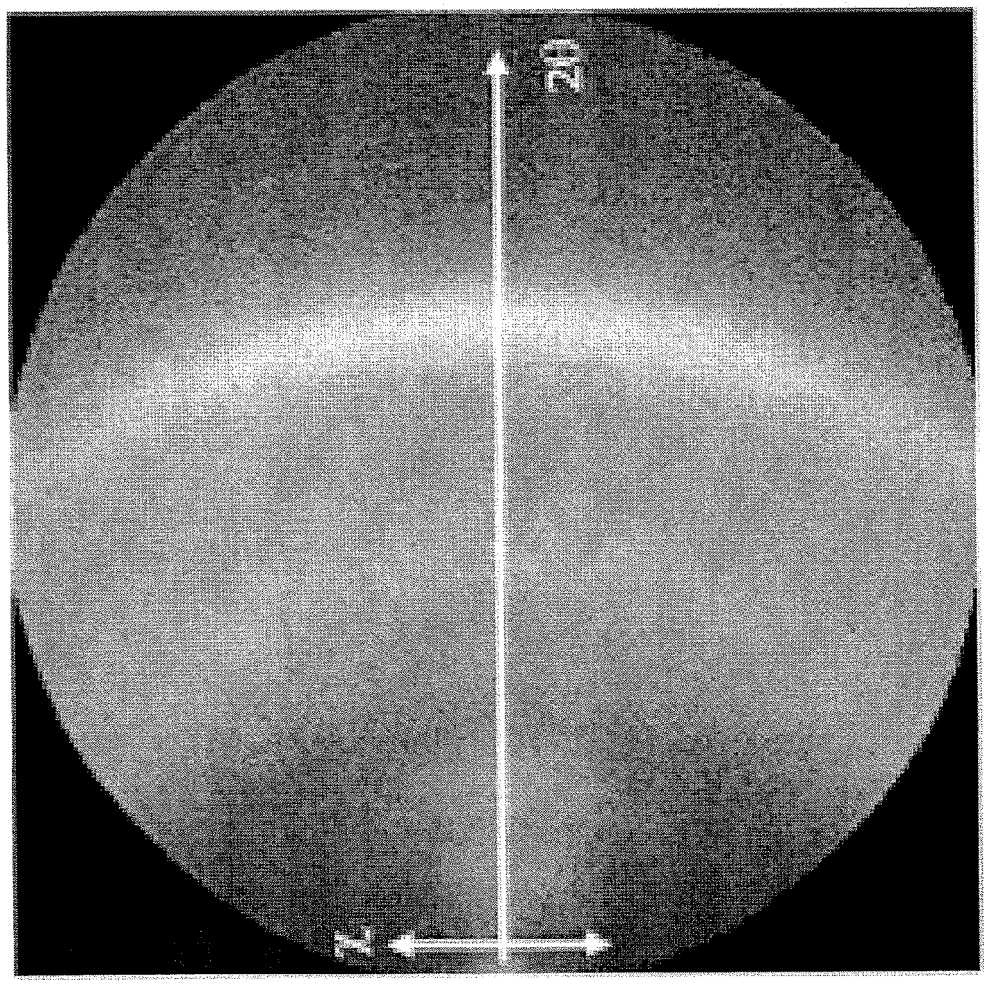
FIG. 8B illustrates a 2D diffraction pattern of a PEDOT:PSS film with addition of 3% EG according to an embodiment.
Figure 8C:
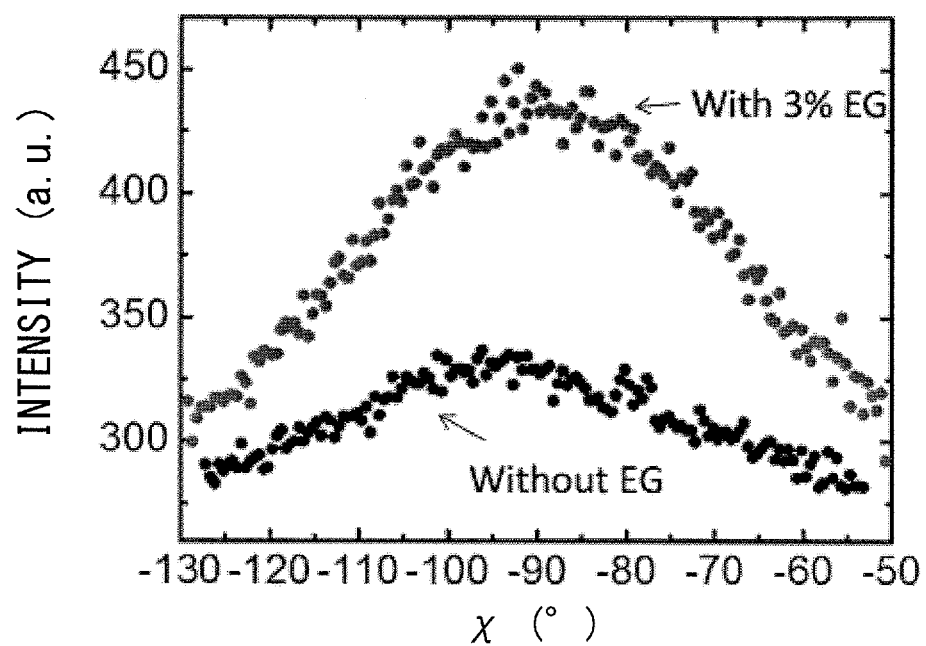
FIG. 8C illustrates pole figures constructed from the 2D diffraction patterns depicted in FIGS. 8A and 8B with respect to the polar angle.

FIGS. 3A and 3B illustrate the 2D GIWAXD patterns of the PEDOT:PSS films without and with addition of EG, respectively. Clear diffractions at q=1.28 Å$^{-1}$ and q=1.85 Å-1 suggested that both films are crystalline. The diffraction at q=1.28 Å$^{-1}$ is assigned to randomly distributed PSS, and the well-defined diffraction at q=1.85 Å$^{-1}$ arose from the (020) reflection of PEDOT crystals (π-π interchain stacking). The EG-added PEDOT:PSS films produced a stronger signal, suggesting the crystallinity is improved. The average crystal size calculated from the full width at half-maximum (FWHM) is increased from 1.9 nm (5-6 layers) to 2.5 nm (7-8 layers) by adding EG to the solution. The films with addition of EG shows more intense (020) reflections along the $q_z$ axis compared with the $q_{xy}$ axis, implying that PEDOT displayed face-on packing, and that the π-conjugated planes of the PEDOT crystal are more vertical with respect to the substrate. The improved crystallinity and preferred orientation of PEDOT are also confirmed by pole figures constructed from the 2D diffraction (FIGS. 8A to 8C).

Figure 4A:
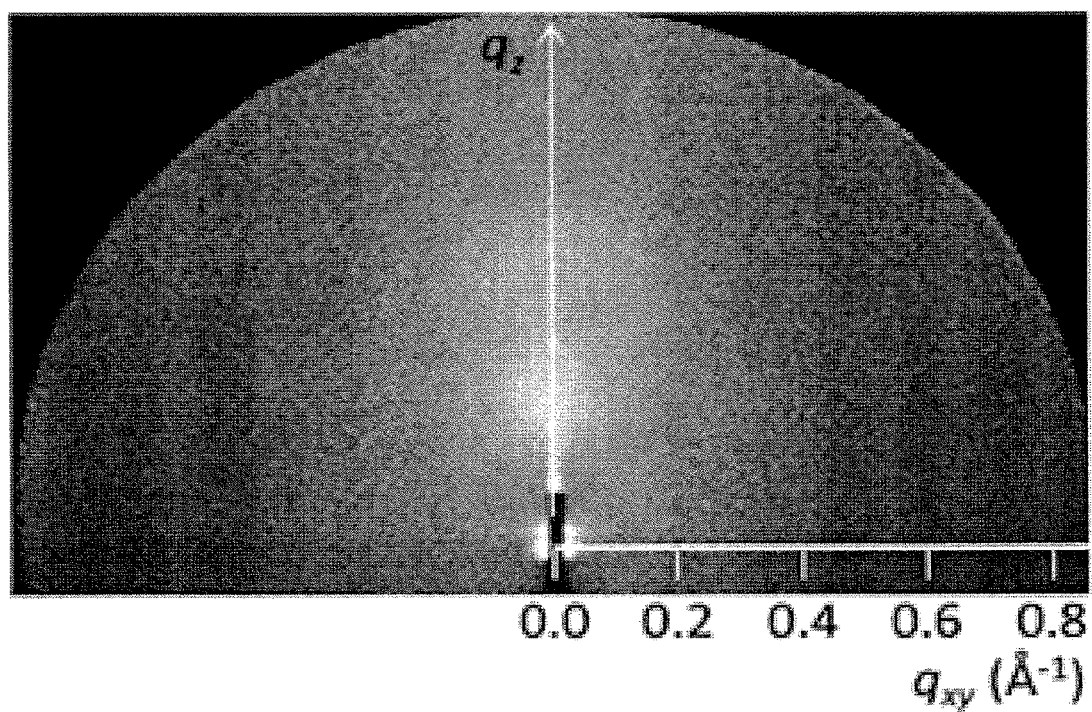
FIG. 4A illustrates a two dimensional GISAXS pattern of a PEDOT:PSS thin film without addition of EG according to an embodiment.
Figure 4B:
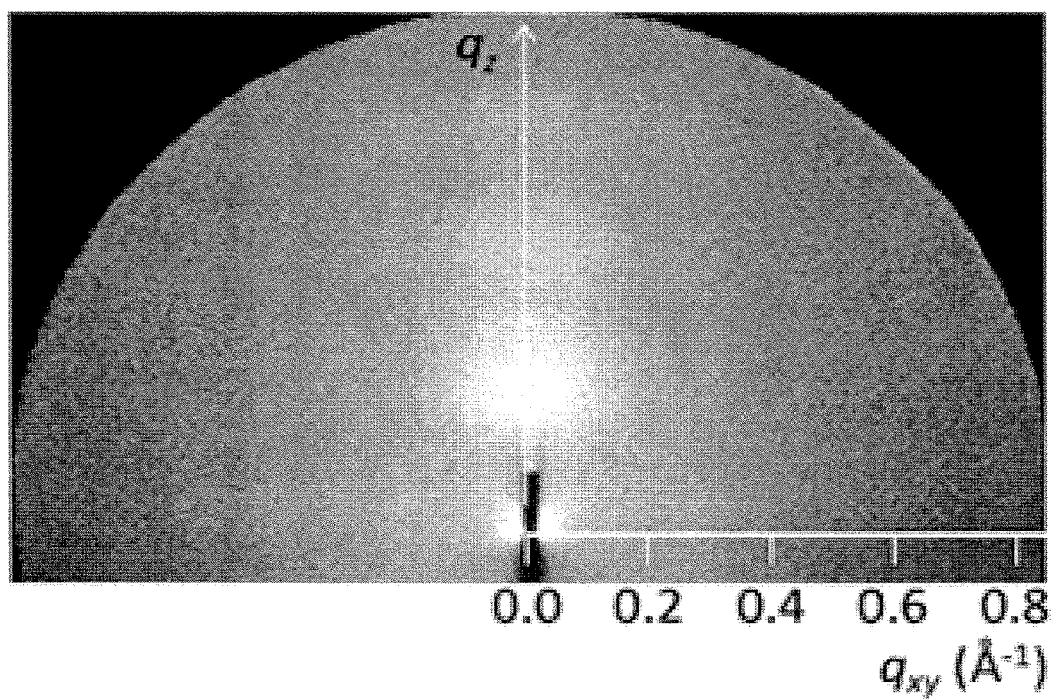
FIG. 4B illustrates a two dimensional GISAXS pattern of a PEDOT:PSS thin film with addition of 3% EG according to an embodiment.
Figure 4C:
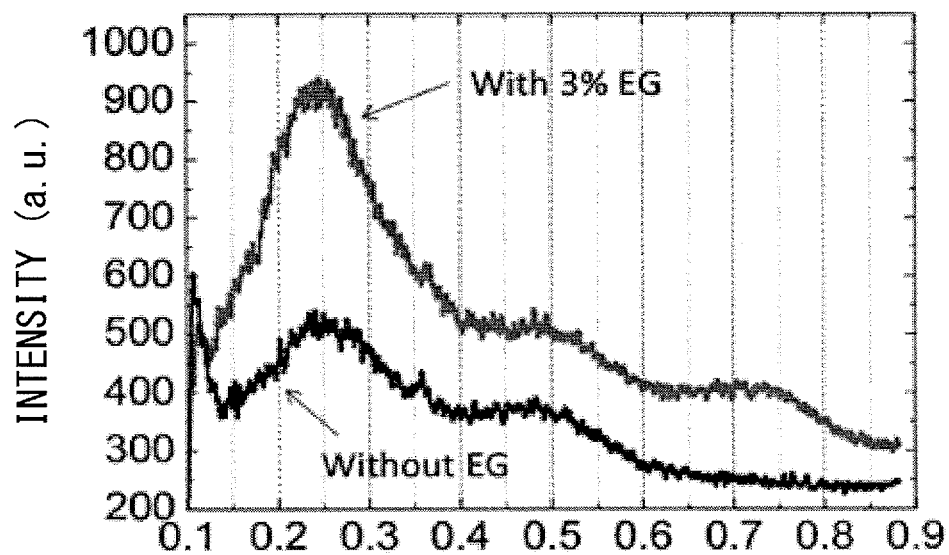
FIG. 4C illustrates a result of detailed line scans along the qz direction according to an embodiment.

The mesoscopic structure of the PEDOT:PSS films over a large surface area is determined by GISAXS. FIGS. 4A and 4B illustrate the 2D GISAXS patterns of the PEDOT:PSS films without and with addition of EG, respectively. Detailed line scans along the $q_z$ direction are illustrated in FIG. 4C. The GISAXS pattern for the film without addition of EG shows an out-of-plane scattering peak at $q_z$=0.24 Å$^{-1}$ and a second-order scattering peak at $q_z$=0.49 Å$^{-1}$. The EG-added film pattern, the scattering peak at $q_z$=0.24 Å$^{-1}$ is sharper, and a third-order peak at a q value three-fold higher than the first is observed. This suggests the addition of EG increased the order of the PEDOT nanocrystal; these nanocrystals should forma layered structure. No obvious peaks are detected in the in-plane direction, implying the structure of the PEDOT nanocrystals are disordered along the $q_{xy}$ direction. This is further supported by the SAXS patterns using transmission geometry (FIGS. 9A and 9B), in which no clear diffraction is observed.

The improvement in the conductivity of PEDOT:PSS by the addition of EG is attributed to the increased crystal ordering and crystal size, which should increase the average carrier mobility in the film. However, the carrier scattering may be dominant at the interface between the PEDOT crystals, because the energy barrier at the interface should be larger. The scattering mechanisms at the interface may not be significantly affected by the crystal ordering and crystal size in this range; therefore the Seebeck coefficient is not changed significantly with addition of EG. To obtain direct evidence of this, the measurement of the Hall effect, which provides the carrier mobility, addition density and effective mass of carriers in the PEDOT:PSS films, is attempted. However, measuring the Hall effect for PEDOT:PSS is very challenging, probably because of the carrier transfer mechanism, the Seebeck effect during current flow, the mobile ions in PEDOT:PSS, and the effect of the small amount of water in the films. However, we are confident that the effect of EG on the electrical conductivity and Seebeck coefficient can be explained by the changes in morphology.

Flash analysis and temperature wave analysis experiments are conducted to estimate the thermal properties of PEDOT:PSS. In both experiments, a large area (>1×1 cm) of highly dense, free-standing film at least 30 μm thick, is critical for reliable measurements. Initially, we attempted to float off the drop casted films using solvents. However, the PEDOT:PSS films are not self-supported on solvents and are very difficult to handle. Low surface energy materials are successfully employed as substrates instead. Cross-linked polydimethylsiloxane (PDMS) is used as the substrate because it displays both hydrophobic and oleophilic properties. The PEDOT:PSS solution (1 mL) is dropped on the surface of PDMS; after the solvent evaporated over several hours the PEDOT:PSS film is easily detached by bending the PDMS substrates slightly. The free-standing films are then annealed at 150° C. for 30 min in air. The thickness of the prepared films is from 30 to 40 μm, and the density is 1.5 g/cm$^3$, which is calculated from the mass and volume, and is closing to the calculated value (1.45 g/cm$^3$). This suggests the as-prepared free-standing PEDOT:PSS films had a dense structure, which is important for determining the intrinsic thermal properties by using temperature wave analysis and flash analysis techniques.

Figure 5:
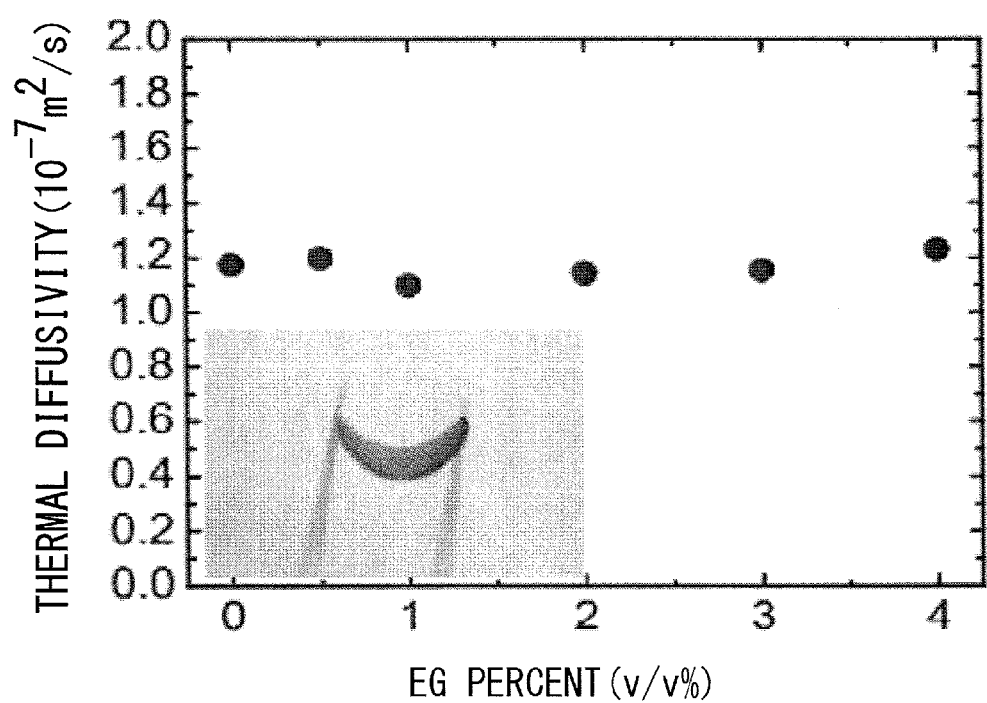
FIG. 5 illustrates thermal diffusivity plotted as a function of the amount of EG in solution according to an embodiment, and an as-prepared free-standing film is depicted in the insert.

FIG. 5 illustrates the dependence of the thermal diffusivity of the PEDOT:PSS films on the EG concentration measured by temperature wave analysis. Interestingly, the thermal diffusivity is almost independent of the EG concentration, whereas the crystallinity and crystal ordering increased. All samples had thermal diffusivity values between $1.1 \times 10^{-7}$ and $1.4 \times 10^{-7}$ m$^2$/s. The thermal conductivity measured by using flash analysis is 0.19 W/mK for the films without addition of EG, and 0.18 W/mK for the films with addition of 3% EG. These results are very different from those of most inorganic thermoelectric materials. This can be explained by the coexistence of conducting PEDOT and insulating PSS. Carriers can only transport in the PEDOT domains of PEDOT:PSS films; therefore the electrical conductivity is strongly affected by the PEDOT crystallinity and ordering. However, the amount of PSS is much larger than that of PEDOT (1:2.5 w/w in PH1000), thus the PSS may be responsible for the thermal diffusivity and thermal conductivity. If the morphology of PSS did not change with the EG concentration, the thermal properties of the solid films should not change significantly. In most highly conductivity PEDOT systems, the amount of dopant is much larger than that of the host, which is very different from inorganic materials. Therefore, the thermal properties should depend on the insulating dopant more than on the conducting host.

Figure 6A:
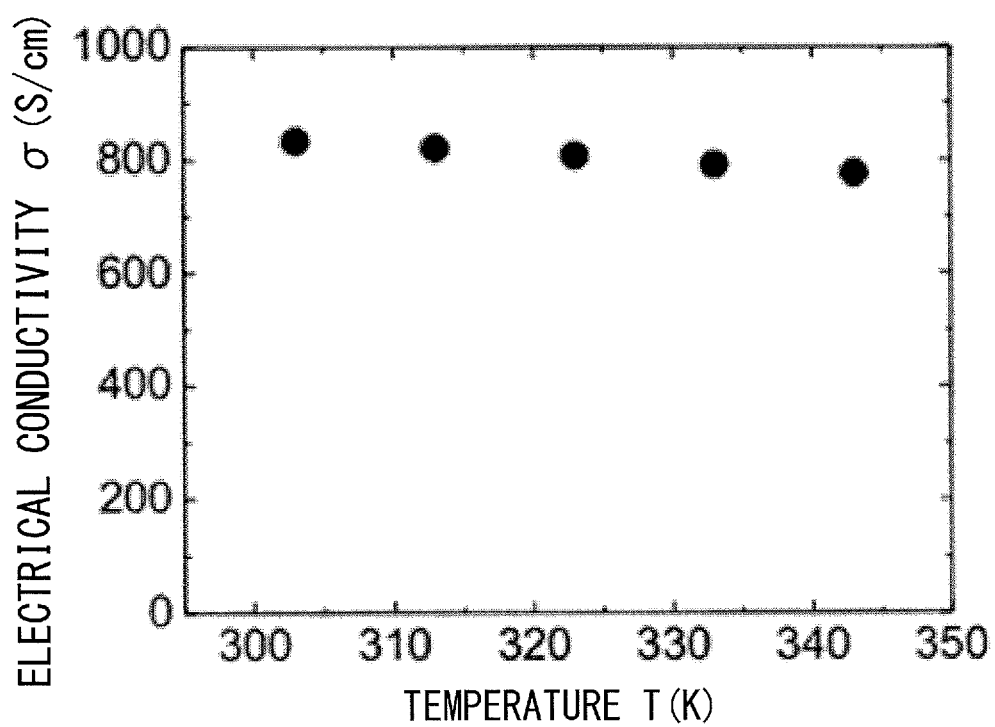
FIG. 6A illustrates electrical conductivity σ of a PEDOT:PSS film with addition of 3% EG plotted as a function of temperature according to an embodiment.
Figure 6B:
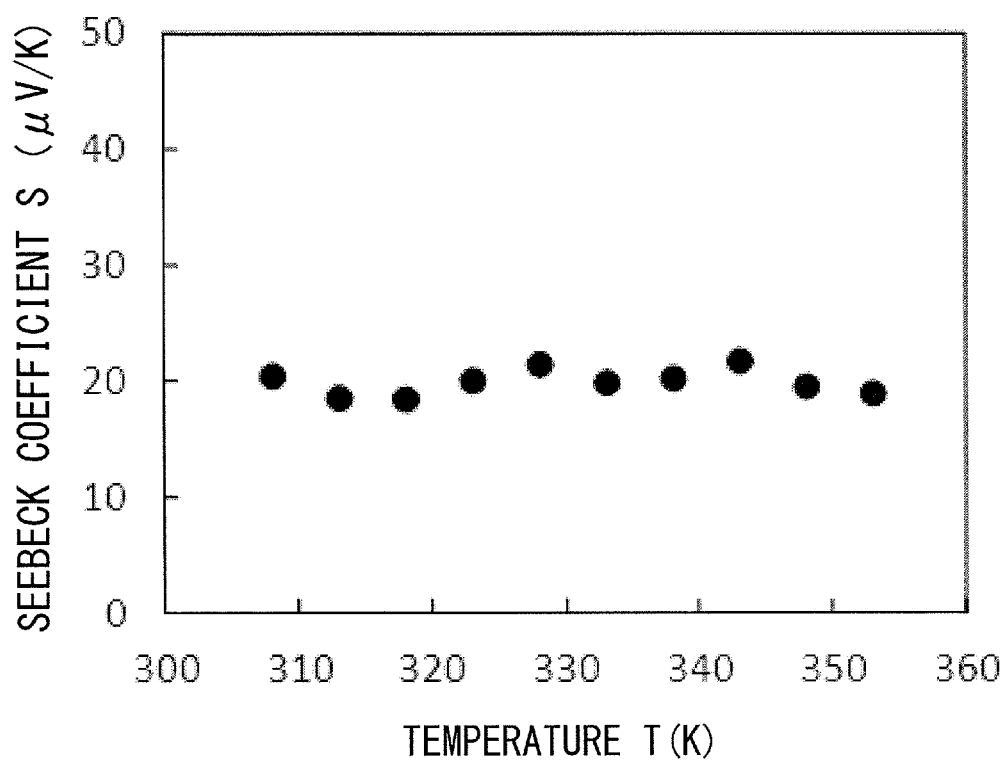
FIG. 6B illustrates Seebeck coefficient S of the PEDOT:PSS film with addition of 3% EG plotted as a function of temperature according to an embodiment.
Figure 10:
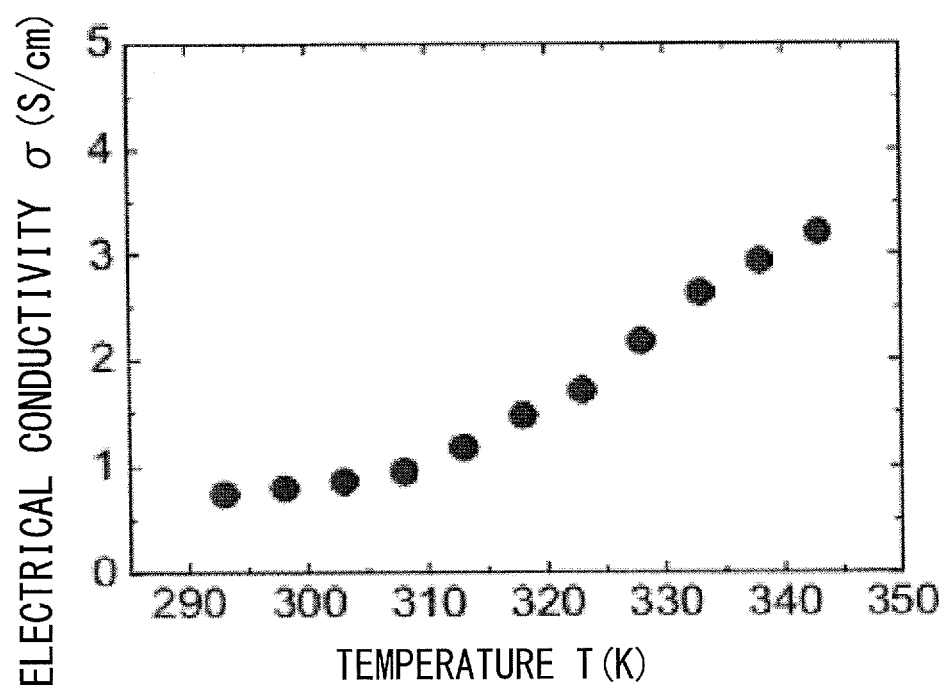
FIG. 10 illustrates electrical conductivity σ of a PEDOT:PSS film without addition of EG plotted as a function of temperature according to an embodiment.

FIG. 6A illustrates the thermoelectric properties of the PEDOT:PSS films with addition of 3% EG. The electrical conductivity decreases from 830 S/cm at 303 K to 770 S/cm at 348 K. The decrease in the electrical conductivity with the increase in temperature might suggest that the EG-added PEDOT:PSS films behaved almost like a metal. This behavior is different from the behaviors of most organic semiconductors and low-conductivity PEDOT:PSS films and the behaviors of the electrical conductivity of the films without addition of EG increases with the temperature as illustrated in FIG. 10. FIG. 6B illustrates the temperature dependence of the Seebeck coefficient of the EG-added PEDOT:PSS films. The positive Seebeck coefficient indicates p-type conduction. The Seebeck coefficient is 20.5 μV/K at 303 K and 21.8 μV/K at 343 K, which suggests the Seebeck coefficient did not have significant temperature dependence in this temperature range. FIG. 7 illustrates the temperature dependence of the thermal properties. The thermal conductivity is measured as 0.17 W/mK at 303 K and 0.18 W/mK at 343 K. The calculated ZT at 303 K for the EG-added PEDOT:PSS films is 0.08. Finally, we must point out the ZT values are calculated from the in-plane electrical conductivity and cross-plane thermal conductivity. Therefore, the possibility remains that the PEDOT:PSS films display anisotropic thermal conductivity caused by the orientation and ordering of the PEDOT nanocrystals. However, we think that the effect of the PEDOT nanocrystals is small, because the thermal conductivity should mainly be determined by the PSS. Our hypothesis is supported by pioneering studies on the PEDOT:tos systems which used the 3ω-technique to illustrate that heat propagation is almost isotropic. We are currently measuring the in-plane thermal conductivity by flash analysis.

In conclusion, the addition of EG to commercially available PEDOT:PSS can increase both the crystal size of PEDOT and the crystal ordering of the film. As a result, the electrical conductivity could be increased to 830 S/cm, whereas the Seebeck coefficient is not decreased. A low thermal conductivity of 0.18 W/mK is confirmed by flash analysis of a dense freestanding sample. Our results suggest that organic semiconducting materials are promising for low-temperature thermoelectric element applications.

Working Example 2

Chemicals. Poly(3,4-ethylenedioxythiophene):poly(styrenesulfonate) (PEDOT:PSS; Clevios PH1000) purchased from H.C. Starck and ethylene glycol (EG, >99.5%) purchased from TCI Chemicals are used.

Film Preparation. For the conductivity and Seebeck coefficient measurements, all films are prepared on glass substrates by drop casting. The PEDOT:PSS solution (400 μL) is applied to a 2×2 cm glass substrate, and the solvent is slowly evaporated over several hours. The film is annealed at 150° C. for 30 min, and the film thickness is equal to or less than 8 μm. The free standing films are prepared on polydimethylsiloxane (PDMS). The PEDOT:PSS solution (1 mL) is dropped on the surface of PDMS. The solvent is evaporated over several hours, and the PEDOT:PSS film is easily detached by bending the PDMS substrates slightly. The thickness of the prepared films is 30-40 μm.

Characterization. The film thickness is measured by using a surface profilometer (Sloan Dektak 3, Veeco). The conductivity is measured with a four-probe conductivity test meter (MCP-T600, Mitsubishi Chemical Corporation), and the temperature is controlled with a hot plate. The Seebeck coefficient is measured with the homemade system illustrated in FIGS. 11A and 11B. The sample holder is heated in a mantle heater, and the temperature difference is achieved by using different metal blocks. The temperature difference and voltage are measured simultaneously by probing the pair of electrodes with a source meter. The thermal conductivity is measured by using a xenon flash analyzer (LFA 447 Nanoflash, Netzsch), and the thermal diffusivity is confirmed by using a temperature wave analyzer (ai-Phase Mobile, ai-Phase). X-ray scattering and diffraction are performed at room temperature using an X-ray diffractometer (D8 Discover, Bruker).

FIG. 8A illustrates a 2D diffraction pattern of a PEDOT:PSS film without addition of EG. FIG. 8B illustrates a 2D diffraction pattern of a PEDOT:PSS film with addition of 3% EG. FIG. 8C illustrates pole figures constructed from the 2D diffraction patterns depicted in FIGS. 8A and 8B with respect to the polar angle.

Figure 9A:
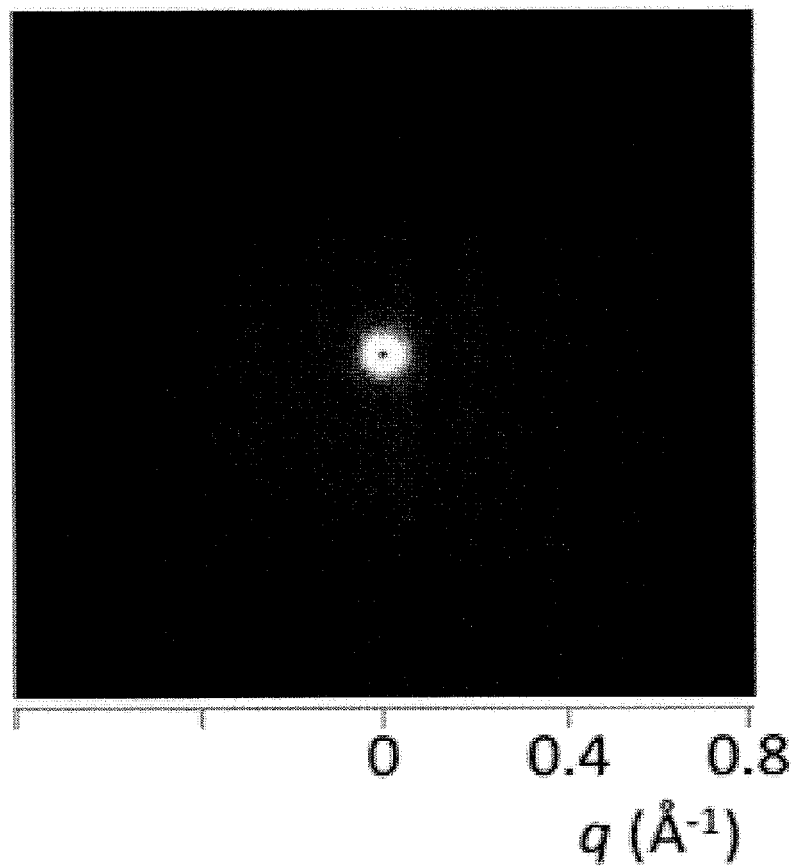
FIG. 9A illustrates a 2D SIXS pattern of a PEDOT:PSS film using transmission geometry without addition of EG according to an embodiment.
Figure 9B:
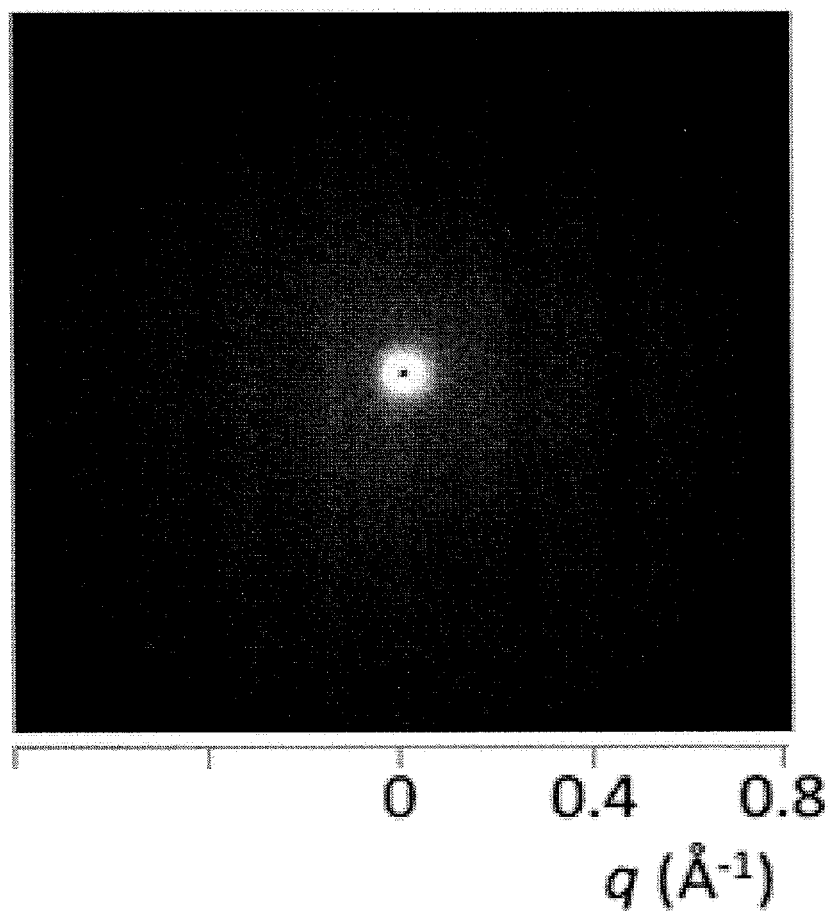
FIG. 9B illustrates a 2D SIXS pattern of a PEDOT:PSS film using transmission geometry with addition of 3% EG according to an embodiment.

FIG. 9A illustrates a 2D SIXS pattern of a PEDOT:PSS film using transmission geometry without addition of EG. FIG. 9B illustrates a 2D SIXS pattern of a PEDOT:PSS film using transmission geometry with addition of 3% EG.

FIG. 10 illustrates electrical conductivity, σ, of a PEDOT:PSS films without addition of EG, plotted as a function of temperature.

Figure 11A:
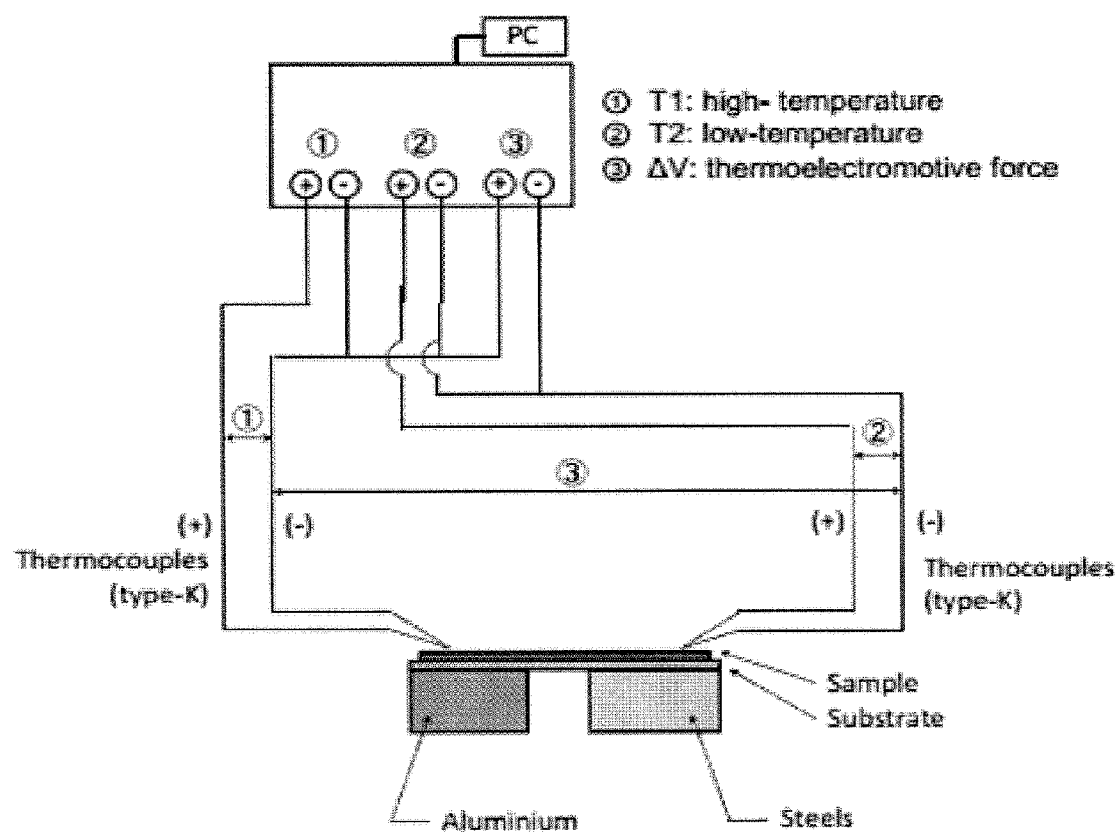
FIG. 11A illustrates a homemade Seebeck coefficient measurement system according to an embodiment.
Figure 11B:
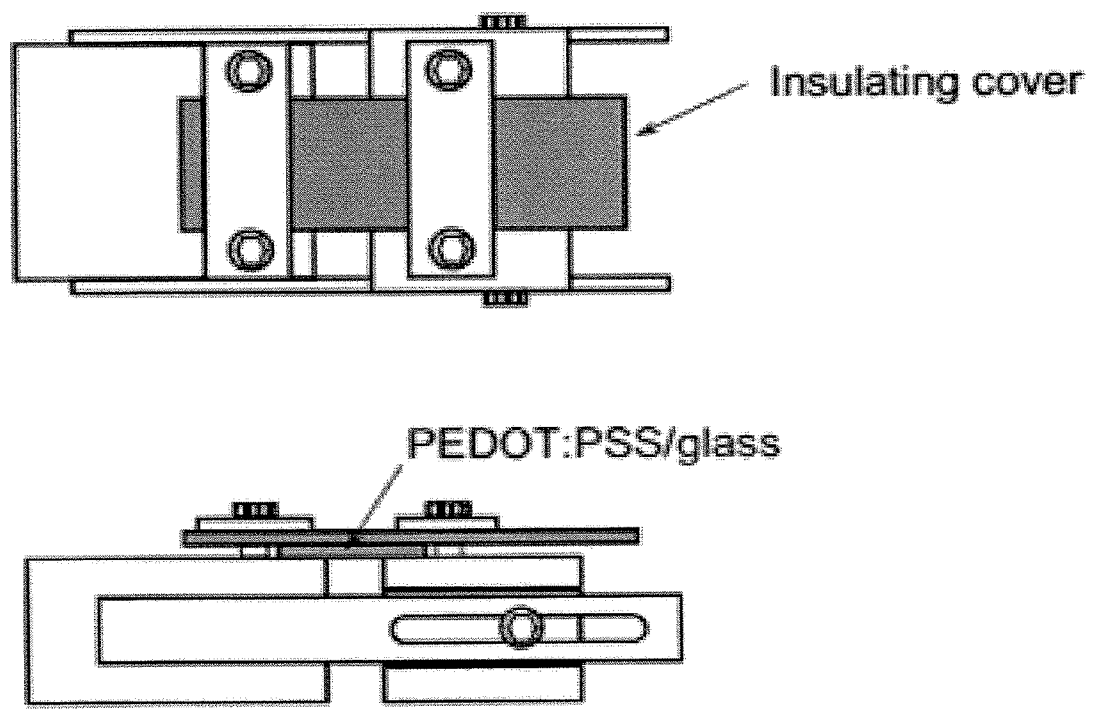
FIG. 11B illustrates a sample holder in the homemade Seebeck coefficient measurement system as illustrated in FIG. 11A.

FIG. 11A illustrates a homemade Seebeck coefficient measurement system. FIG. 11B illustrates a sample holder thereof.

As described above, a thermoelectric material is obtained by a simple process which only includes an annealing at 150° C. for 30 min. In addition, the structures of the obtained organic films are examined by X-ray diffraction to find that the treatment at 150° C. for 30 min is appropriate for obtaining structures having crystal orientations. A feature of the present invention is that a simple process as described above may be employed. Further, there have been no examples that the effects of ethylene glycol are precisely examined from the structural examination by X-ray diffraction.

Essentially, although it is known that the electrical conductivity is improved when ethylene glycol is introduced, the reasons are not apparent. Clevios PH1000 is an aqueous solution in which PEDOT:PSS is dispersed, and it is considered that when solid PEDOT:PSS is obtained by simply drying the solution, the crystal structure of the obtained organic solid film may not be aligned sufficiently because water evaporates relatively quickly. On the other hand, ethylene glycol has a boiling point of 197.3° C., which is twice as high as that of water, and it is considered that time may be ensured for the crystal structure to be aligned because ethylene glycol evaporates more slowly than water. Additionally, as described above, the structures of the obtained films are examined by X-ray diffraction to find that there are some correlations between the crystal orientations and the electrical conductivity. Moreover, it also found that sufficient results may be obtained with the additive amount of ethylene glycol equal to or higher than 3% rather than 5%. Clevios PH1000 is an aqueous solution and made mostly of water, and Clevios PH1000 contains merely a few percent of PEDOT:PSS. In the present invention, it is advantageously determined whether 5% is required or not and whether 3% is enough or not regarding this "few percent".

One of the features of the present invention is that a technique for precisely controlling the structures of organic semiconductor films is established and that the electrical conductivities, Zeebeck coefficients and the values of ZT may be increased. Further, in the present invention, a self-supported film (free-standing film) is obtained, and then the density is observed and the thermal conductivity is acquired on the basis of the measurement. In the present invention, it is featured that the large ZT values are actual measurement values.

Figure 12:
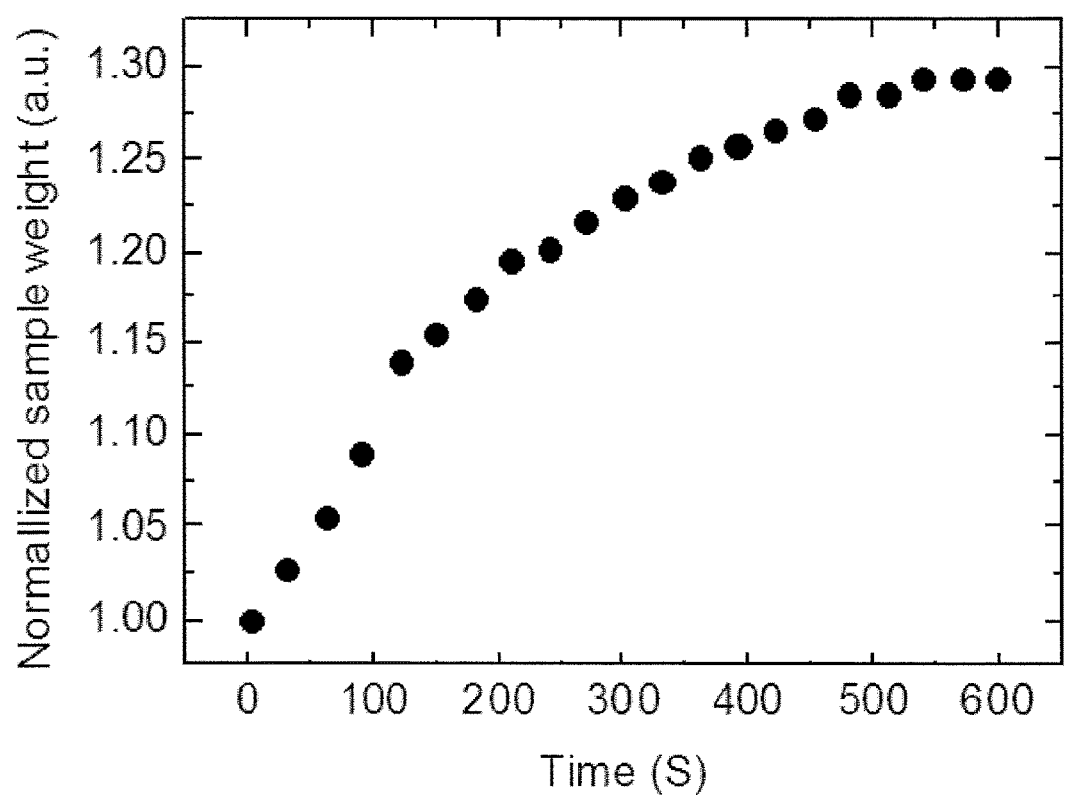
FIG. 12 illustrates variations in weight of a PEDOT:PSS when a thermoelectric material according to an embodiment retained in an atmosphere of 298 K and a relative humidity of 60%.

Next, it is understood from FIG. 12 that water may change the characteristics of organic thermoelectric materials. FIG. 12 is a diagram illustrating the weight variation of PEDOT:PSS when PEDOT:PSS is kept in an atmosphere with relative humidity of 60%. As illustrated in FIG. 12, the weight of PEDOT:PSS increases by 30% before the weight starts to vary. This is because the film of PEDOT:PSS contains water. It is noted that the thickness of the film increases by 30% similarly when calculated.

Figure 13A:
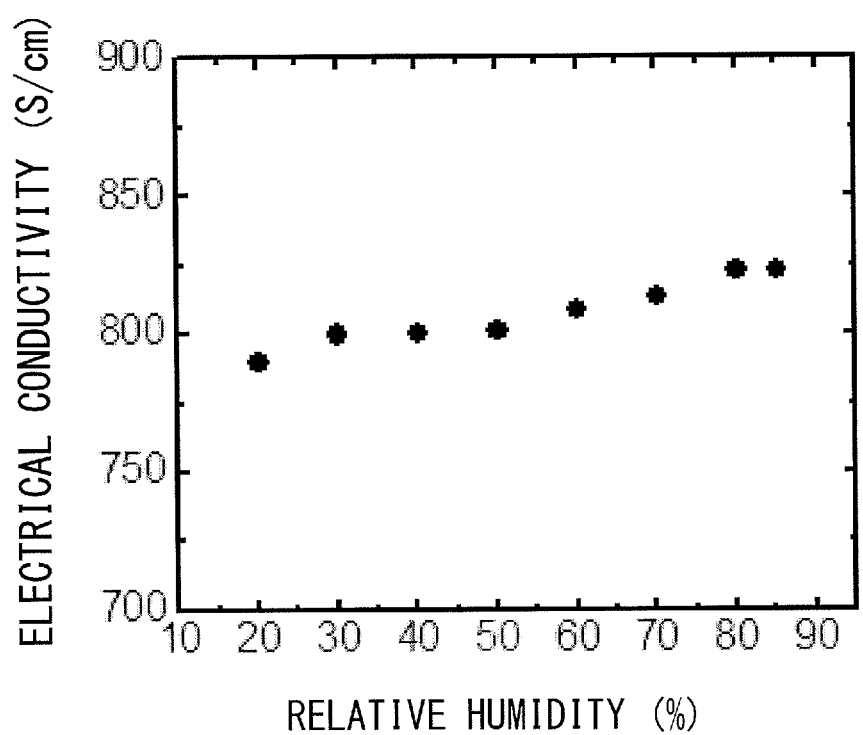
FIG. 13A illustrates relations between relative humidity and electrical conductivity according to a thermoelectric material according to an embodiment.
Figure 13B:
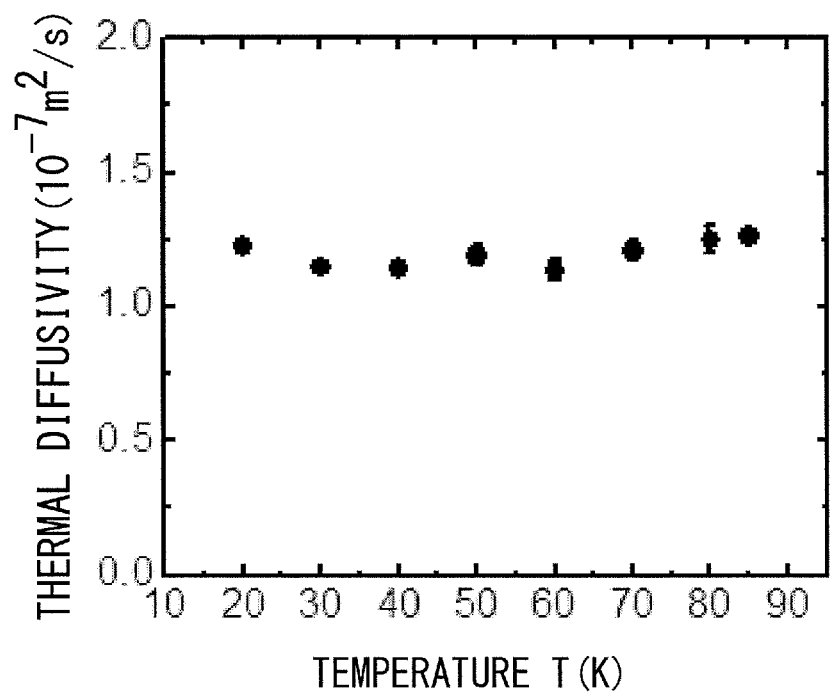
FIG. 13B illustrates relations between relative humidity and thermal diffusivity according to a thermoelectric material according to an embodiment.

FIGS. 13A and 13B illustrate measurement results of a thermoelectric material according to the present embodiment in a glove box with the relative humidity varied. FIG. 13A illustrates a measurement result of the electric conductivity of the thermoelectric material. And FIG. 13B illustrates a measurement result of the thermal diffusivity of the thermoelectric material. As illustrated in FIG. 13A, the electric conductivity increases as the humidity increases, which leads to characteristic increase. In addition, as illustrated in FIG. 13B, the thermal diffusivity of the thermoelectric material does not change as the humidity varies, which does not lead to characteristic deterioration.

Figure 14A:
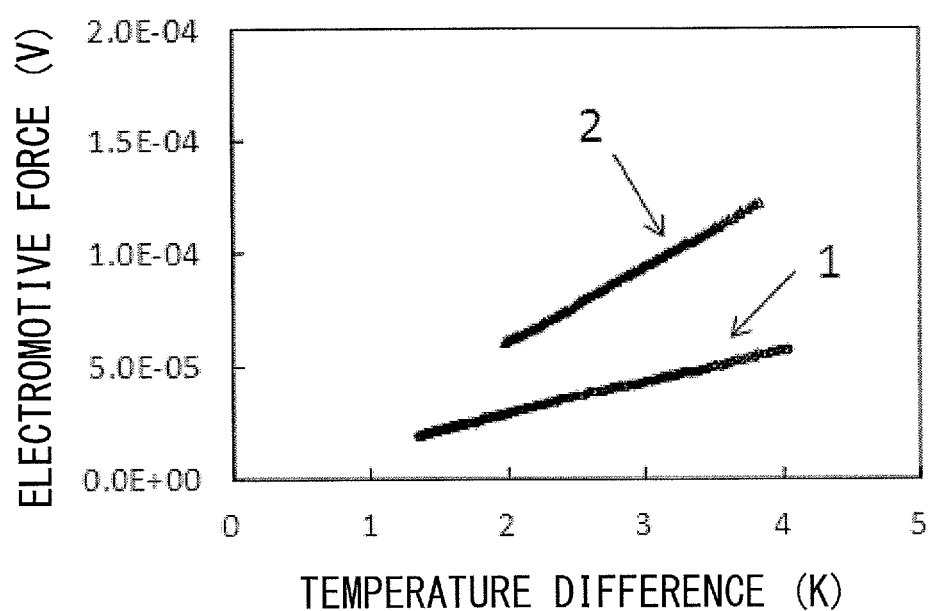
FIG. 14A illustrates a graph of ΔV/ΔT at 303 K of a thermoelectric material according to an embodiment, where the line indicated by "1" corresponds to the relative humidity of 30% and the line indicated by "2" corresponds to the relative humidity of 50%.
Figure 14B:
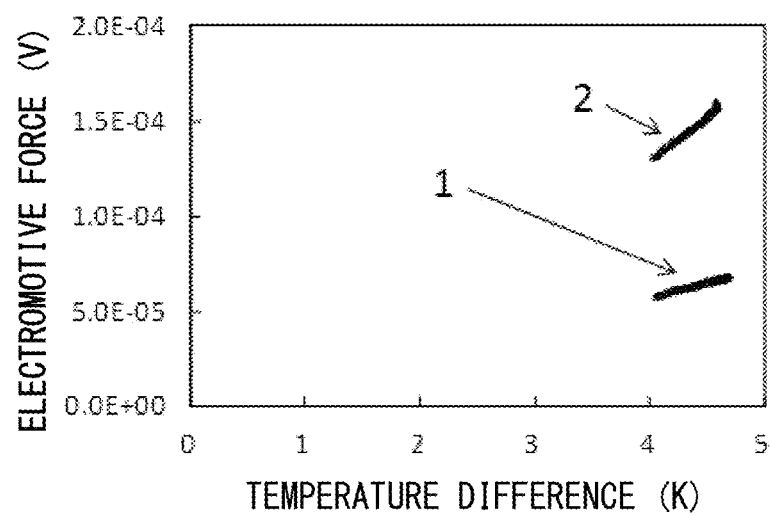
FIG. 14B illustrates a graph of ΔV/ΔT at 313 K of a thermoelectric material according to an embodiment, where the line indicated by "1" corresponds to the relative humidity of 30% and the line indicated by "2" corresponds to the relative humidity of 50%.

FIGS. 14A and 14B illustrates graphs of $\Delta V/\Delta T$ of an organic thermoelectric material according to the present embodiment. A Seebeck coefficient S can be calculated based on the gradient of a graph. In FIGS. 14A and 14B, the graph indicated by "1" illustrates a variation in case of the relative humidity of 30% (the amount of water is 9.114 g/m$^3$) and the temperature of 30° C. In addition the graph indicated by "2" illustrates a variation in case of the relative humidity of 50% (the amount of water is 15.19 g/m$^3$) and the temperature of 30° C. Since the reliability of the measurement can be determined based on the linearity of the graph, it can be said that the linearity of the graphs as illustrated FIGS. 14A and 14B is preferable. FIG. 14A illustrates a comparison result at the temperature T=30° C. (303K) since a wide temperature range can be set so that the variation can be easily recognized. When Seebeck coefficients are calculated based on each graph, S=14 μV/K is obtained for the case of the relative humidity of 30% (the temperature is 30° C.). In addition, S=33 μV/K is obtained for the case of the relative humidity of 50% (the temperature is 30° C.) and is larger than the Seebeck coefficient for the case of the relative humidity of 30% (the temperature is 30° C.). FIG. 14B illustrates a comparison result at the temperature T=40° C. (313K). S=15.6 μV/K is obtained for the case of the relative humidity of 50% (the temperature is 40° C.). In addition, S=48.4 μV/K is obtained for the case of the relative humidity of 50% (the temperature is 40° C.). When the electric conductivity is set to 800 S/cm and the thermal diffusivity is set to 0.18 W/mk because the diffusivity coefficient is not varied based on the results in FIGS. 13A and 13B, the maximum value of ZT is 0.33 with the relative humidity of 50% and at the temperature of 40° C. Therefore, the characteristic of the thermoelectric material according to the present embodiment can be increased by control of the amount of water. It is noted that the above values are illustrated in FIG. 14C.

From the measurements as illustrated in FIGS. 14A to 14C, the Seebeck coefficient S and the electric conductivity σ increase as the amount of water increases. In addition, the Seebeck coefficient increases as the temperature is raised. That is, the Seebeck coefficient at the temperature of 313K is larger than the Seebeck coefficient at the temperature of 303K. Although κ cannot be measured directly, it can be assumed that the value of ZT also increases as the amount of water increases since κ=(thermal diffusivity coefficient)×(specific heat)×(density) and the thermal diffusivity coefficient does not vary as described above in the present embodiment.

Next, the manufacturing of a thermoelectric element and thermoelectric module according to the present embodiment is described. In the manufacturing the thermoelectric module, the internal resistance, that is impedance, of the module as a whole is required to be low. In addition, the elements in the module can be connected in series to achieve a larger voltage. However, when the elements are connected in series and one of the elements connected is damaged, the module cannot be used practically. Therefore, both the series connection and the parallel connection of the elements are employed to decrease the resistance in the thermoelectric module in the present embodiment. FIGS. 15A to 15D includes schematic structural diagrams and a diagram of the manufacturing steps of a thermoelectric element according to the present embodiment. The longer a PEDOT:PSS element becomes, the larger the temperature difference becomes. But the resistance also becomes larger at the same time. In addition, the larger the thickness of the element becomes, the smaller the resistance becomes. For example, the length, the width and thickness of one PEDOT:PSS element in the present embodiment is 40 mm, 2 mm and 30 µm, respectively. And, the resistance of the PEDOT:PSS element is equal to or less than 20Ω. it is noted that the height of PEDOT:PSS aqueous solution should be 5 mm to prepare a PEDOT:PSS element with the thickness of 30 µm. Therefore, PEDOT:PSS aqueous solution is poured into a mold form and the poured PEDOT:PSS aqueous solution is heated to evaporate water of the solution to obtain an organic thermoelectric film.

Figure 15A:
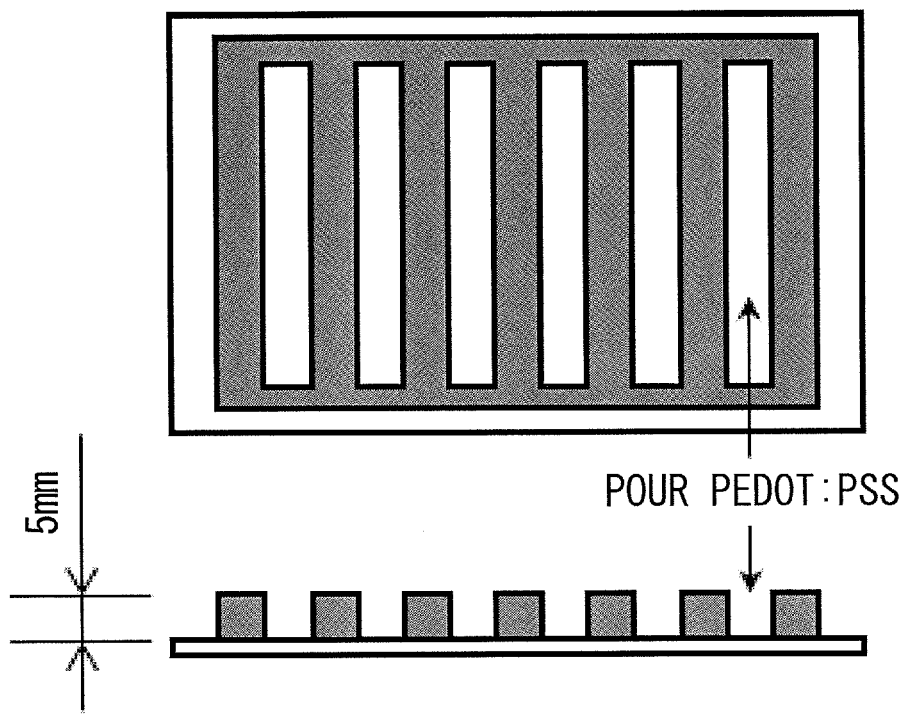
FIG. 15A illustrates an example of a method of manufacturing an organic thermoelectric film according to an embodiment.
Figure 15B:
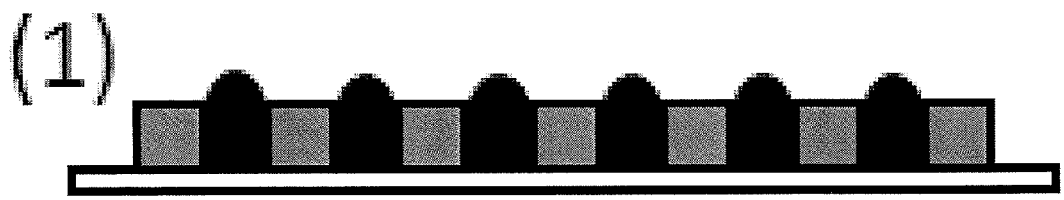
FIG. 15B illustrates an example of a method of manufacturing an organic thermoelectric film according to an embodiment.
Figure 15C:
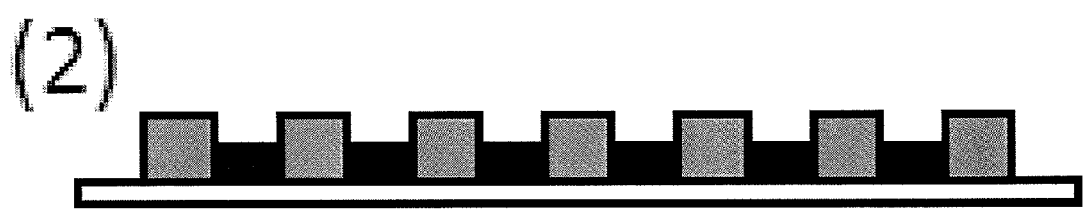
FIG. 15C illustrates an example of a method of manufacturing an organic thermoelectric film according to an embodiment.
Figure 15D:
FIG. 15D illustrates an example of a method of manufacturing an organic thermoelectric film according to an embodiment.

As illustrated in FIGS. 15B to 15D, (1) PEDOT:PSS aqueous solution is poured into a mold form. Next, (2) the PEDOT:PSS aqueous solution is heated at the temperature of 70° C. for 36 minutes to evaporate water of the solution to a certain degree. Next, the mold form is removed and the PEDOT:PSS aqueous solution obtained by the process (2) is further heated at the temperature of 150° C. for 20 minutes to evaporate the solvent. As a result an organic thermoelectric film can be obtained. It is noted that when the solvent is evaporated in the process (2) completely, the aqueous solution is fixed to the mold form so that the film is damaged. Therefore, the mold form is removed while the PEDOT:PSS aqueous solution is in a damp-dry condition.

The processing temperature and the processing time of the manufacturing of the organic thermoelectric film according to the present embodiment as described above is a preferable condition in case of using a paper board as a substrate and stainless steel as the mold form. Therefore, the conditions depend on the material used for the substrate and the mold form and the processing time depends on the processing temperature. The condition of 150° C. and 20 minutes for the annealing as described above is a condition for manufacturing a single unit of PEDOT:PSS. When the thermoelectric element is manufactured, the temperature is selected from the range from 125 to 200° C. according to the method employed for the manufacturing, and then the processing time is determined.

Further, when the material (PEDOT:PSS) is manufactured on the substrate including a paper, the characteristic of the material can be improved by applying steam treatment to make the material to contain water and adjusting the amount of water included in the material. The atmospheric condition such as the humidity, the temperature, the retaining time etc. can be arbitrarily changed according to the shape of the material. And a process including a sealing process is applied to the element and the substrate after the steam treatment for example. The process including the sealing process can inhibit the evaporation of water included in the element and the substrate. In addition, organic semiconductors generally may deteriorate in characteristics when the amount of water slightly varies. However, since the water included in the thermoelectric element contributes a preferable improvement of the characteristics of the element, the variation of the amount of water included in the element is not a sensitive factor which changes the characteristics of the element. Therefore, a process such as wrapping which is a process of covering the element with a film using polyvinylidene chloride etc. and sealing which is a process of sealing the element using glass or a process of sealing the element using flexible material such as plastic can be employed to maintain the high characteristic of the thermoelectric element in the present embodiment.

Figure 16A:
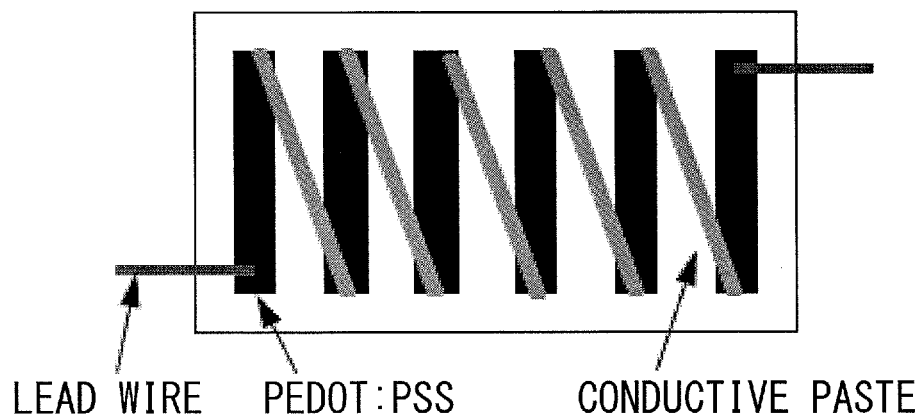
FIG. 16A schematically illustrates a configuration of a thermoelectric module according to an embodiment.
Figure 16B:
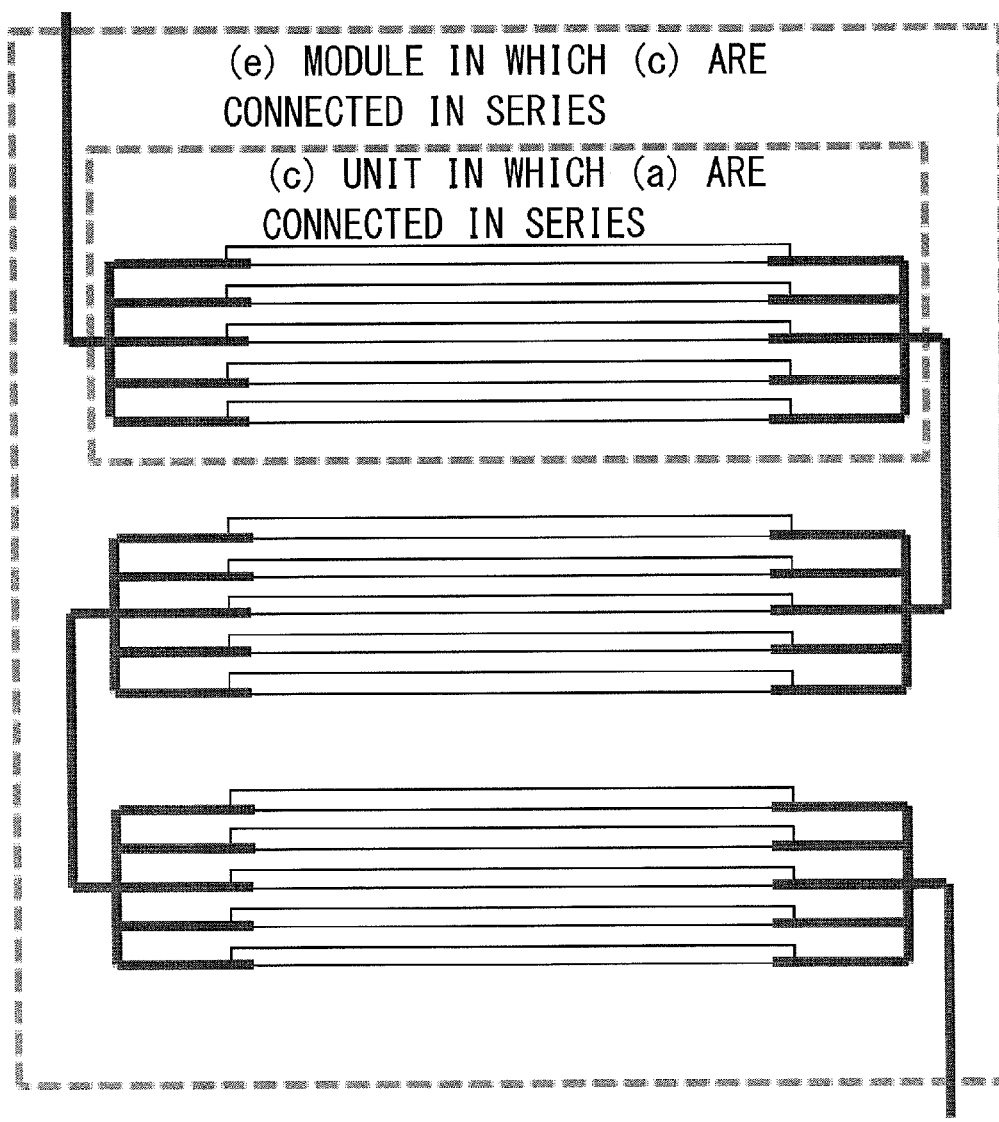
FIG. 16B schematically illustrates a configuration of a thermoelectric module according to an embodiment.
Figure 17A:
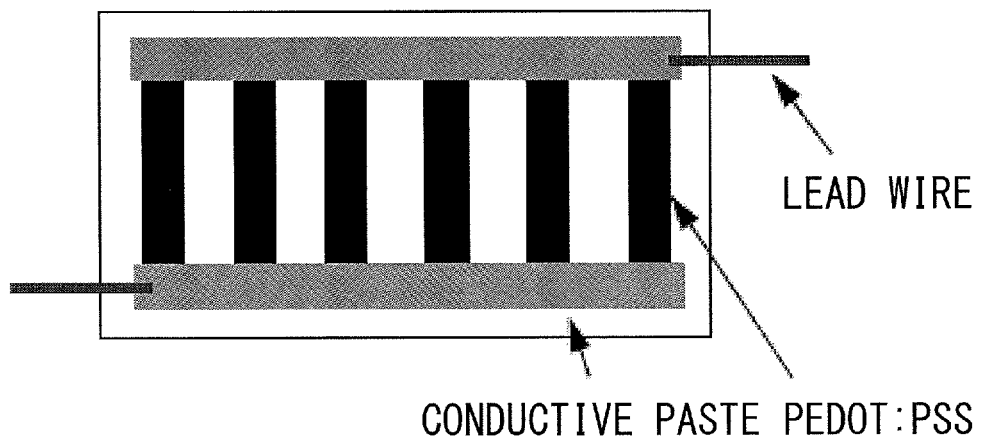
FIG. 17A schematically illustrates a configuration of a thermoelectric module according to an embodiment.
Figure 17B:
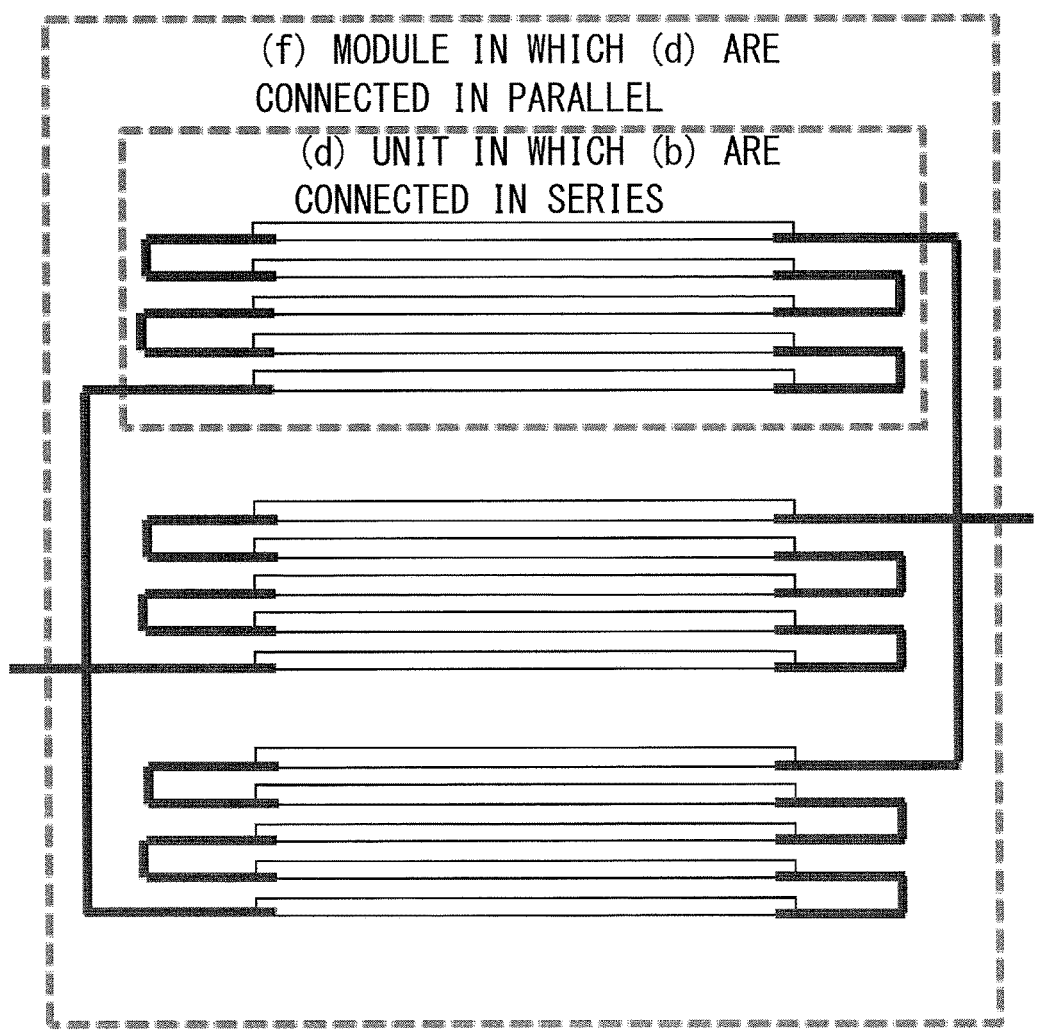
FIG. 17B schematically illustrates a configuration of a thermoelectric module according to an embodiment.

FIGS. 16A and 16B illustrate examples of a module using elements in which the organic thermoelectric materials are connected in series according to the present embodiment. In addition, FIGS. 17A and 17B illustrates examples of a module using elements in which the organic thermoelectric materials are connected in parallel according to the present embodiment. It is noted that "(a)" in FIG. 16B indicates "(a)" in FIG. 16A and "(b)" in FIG. 17B indicates "(b)" in FIG. 17A. When the module as illustrated in FIGS. 16A and 16B is manufactured, an element as indicated by (a) in FIG. 16A in which organic thermoelectric materials are connected in series is manufactured at first. Next, a plurality of elements as indicated by (a) in FIG. 16B in which organic thermoelectric materials are connected in series are manufactured and a unit as indicated by (c) in FIG. 16B in which the plurality of elements are connected in parallel is manufactured. And then the manufactured units are connected in series to manufacture a module using organic thermoelectric material according to the present embodiment as indicated by (e) in FIG. 16B.

When a module as illustrated in FIGS. 17A and 17B is manufactured, an element as indicated by (b) in FIG. 17A in which organic thermoelectric materials are connected in parallel is manufactured at first. Next, a plurality of elements as indicated by (b) in FIG. 17B in which organic thermoelectric materials are connected in parallel are manufactured and a unit as indicated by (d) in FIG. 17B in which the plurality of elements are connected in parallel is manufactured. And then the manufactured units are connected in parallel to manufacture a module using organic thermoelectric material according to the present embodiment as indicated by (f) in FIG. 17B.

Figure 18A:
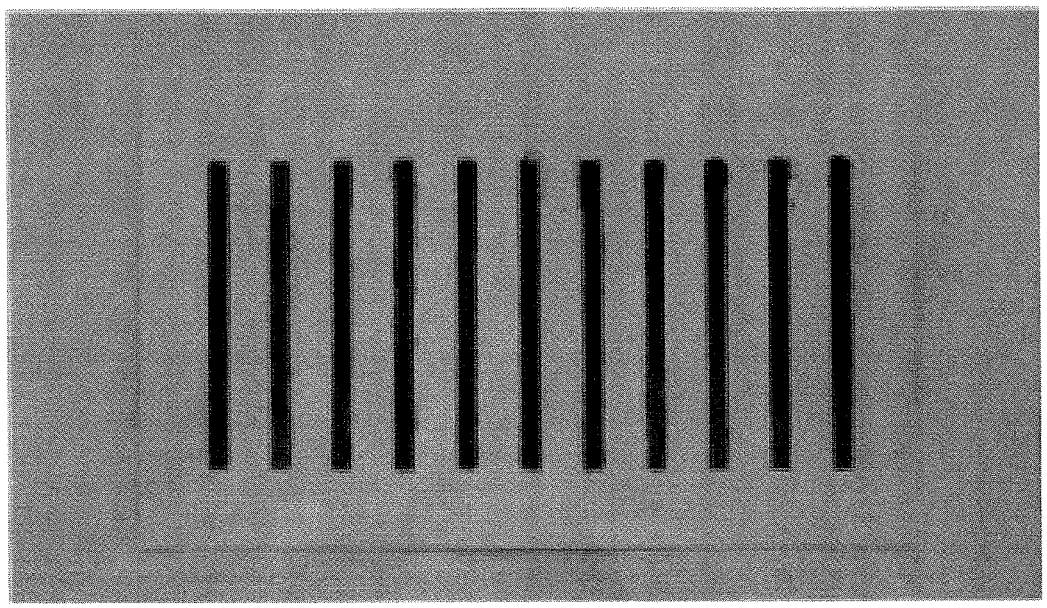
FIG. 18A illustrates an example of a method of manufacturing an thermoelectric element according to an embodiment.
Figure 18B:
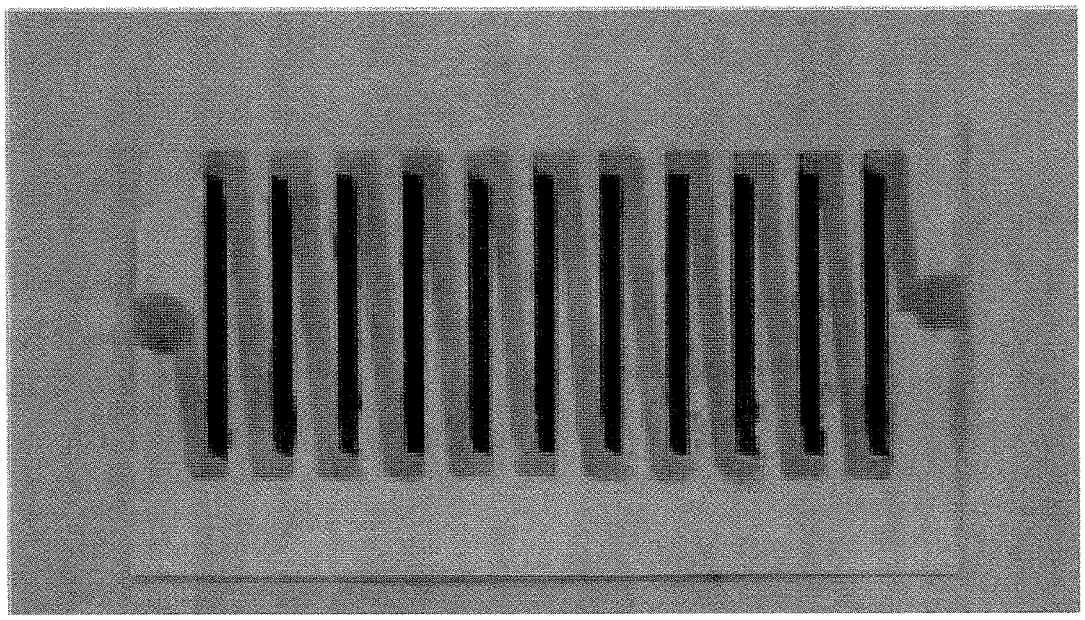
FIG. 18B illustrates an example of a method of manufacturing an thermoelectric element according to an embodiment.
Figure 19:
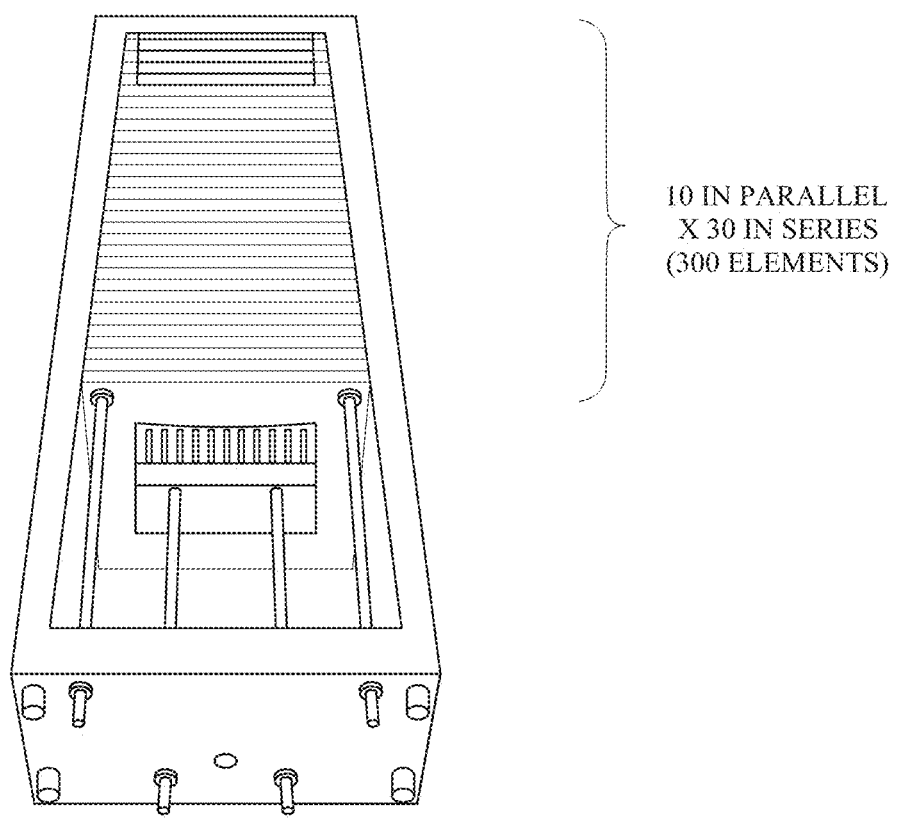
FIG. 19 illustrates an example of a method of manufacturing an thermoelectric module according to an embodiment.

FIGS. 18A and 18B illustrate an example of an element manufactured using an organic thermoelectric material according to the present embodiment. PEDOT:PSS is applied onto a paper substrate at first as illustrated in FIG. 18A. In the example in FIG. 18A, eleven pieces of PEDOT:PSS with the length of 40 mm, the width of 2 mm and the thickness of 30 µm are applied onto the paper substrate at equal intervals. And then, each piece of the PEDOT:PSS applied onto the paper substrate is connected in series with conductive silver paste. FIG. 19 illustrates a manufactured module in which the thermoelectric element as described above is sandwiched with cupper plates which have a preferable thermal conductivity and each element is connected with each other. The module as illustrated in FIG. 19 includes 300 elements with 10 in parallel and 30 in series. In this case, the output from 50 to 100 µW can be obtained in case of ΔT=50 K.

Figure 20:
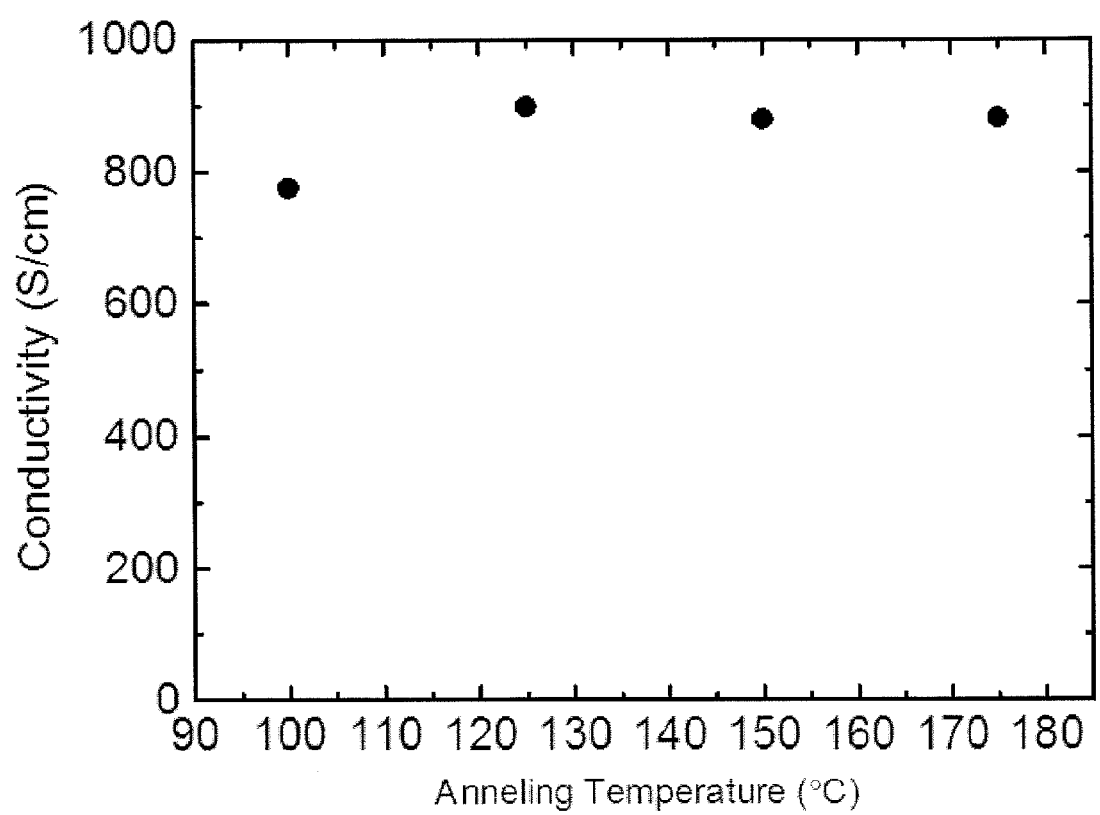
FIG. 20 illustrates relations between heat process temperature and electrical conductivity of a thermoelectric material according to an embodiment.

FIG. 20 illustrates the relations between the a temperature and the electric conductivity in the annealing in the manufacturing of a thermoelectric material according to the present embodiment. The electric conductivity of the manufactured thermoelectric material may decrease at the temperature below 125° C. as illustrated in FIG. 20. In addition, PEDOT itself is decomposed at the temperature over 200° C. Therefore, the preferable temperature for the annealing in the manufacturing of the thermoelectric material according to the present embodiment ranges from 125° C. to 200° C. Further, when the annealing with the preferable temperature is performed for more than 5 minutes can evaporate water and EG in the solution to a certain degree. Therefore, the processing time of the annealing can preferably be set to be more than 5 minutes in the present embodiment. It is noted that the processing time of the annealing can be set to be more than 30 minutes to ensure the evaporation of water and EG in the solution in the present embodiment.

It is noted that the annealing process is a process for manufacturing a film by evaporate the PEDOT:PSS solution including EG. And the annealing is required to progress slowly to arrange the film structure, namely to control the film structure. That is, when the PEDOT:PSS aqueous solution with addition of EG, the boiling point of which is higher than that of water, EG evaporate at the speed which is slower than that of water, and then the film structure is arranged in a preferable manner. As a result, the carrier mobility in the film can be increased and the electric conductivity can be increased. However, when the annealing temperature is set too low, EG, the boiling point of which is 197° C. is difficult to be evaporated. Therefore, it is more preferable to set the annealing temperature to about 150° C. In addition, the processing time of the annealing is preferably set to be within 12 hours.

Moreover, conductive polymer can be used instead of PEDOT in the present embodiment. The conductive polymer includes polyimide and polyaniline. In addition, tosylate (TOS), chlorine (Cl), perchloric acid ($ClO_4$) etc. can be used instead of PSS in the present embodiment. When PEDOT is used in manufacturing the thermoelectric material, PSS, which is stable and disperse preferably, is used in the present embodiment.

Further, when PEDOT is used as aqueous solution in the present embodiment, a material with a high permittivity can be used instead of EG. Such alternative material includes ethanol, dimethylsulfoxide (DMSO) and isopropanol, for example. Although ethanol and isopropanol can be used in terms of the permittivity, the boiling point of ethanol is 78° C. and the burning point of ethanol is 13° C. and the boiling point of isopropanol is 82.4° C. and the burning point of isopropanol is 11.7° C. Therefore, ethanol and isopropanol cannot be expected to be used to control the film structure. Further, since the boiling point of DMSO is 189° C. and the burning point of DMSO is 87° C., DMSO can be expected to control the film structure as EG does. However, DMSO is required to be treated in consideration of the fact that DMSO has a characteristic of penetration of skin. With this in mind, EG is easier to be treated by a person conducting the annealing than the above materials since EG can be used as antifreeze for example.

INDUSTRIAL APPLICABILITY

The thermoelectric material can be applied to solar cells because not only light but also unused heat can be converted into electricity. In addition, the thermoelectric material can be applied to devices attached to a human body including pacemakers and wrist watches. Further, the thermoelectric material can be applied to energy conservation fields in which low temperature waste heat below 200° C. is recovered as electricity.

What is claimed is:

1. A method of preparing a thermoelectric material, comprising:
   annealing a material that comprises a conductive polymer, polystyrene sulfonate (PSS), and a solvent selected from the group consisting of ethylene glycol and dimethyl sulfoxide at a temperature from 125° C. to 200° C. for a time from 5 minutes to 12 hours; and
   applying steam treatment to make the material contain water, wherein the conductive polymer is Poly(3,4-ethylenedioxythiophene) (PEDOT).

2. The method according to claim 1, wherein the solvent is ethylene glycol with an additive amount of equal to or more than 3% by weight.

3. The method according to claim 1, wherein the temperature is about 150° C.

4. The method according to claim 1, wherein the time is at least 30 minutes and less than 12 hours.

5. The method according to claim 1, further comprising: sealing the material after the applying steam treatment to make the material contain water.

6. A method of preparing a thermoelectric module, comprising: obtaining the thermoelectric module by using a p-type or an n-type of a thermoelectric material prepared by the method according to claim 1.

7. A method of preparing a thermoelectric module, comprising: obtaining the thermoelectric module by combining a p-type or an n-type of a thermoelectric material prepared by the method according to claim 1.

8. A method of preparing a thermoelectric module, comprising:
   electrically connecting a plurality of a thermoelectric material prepared by the method of claim 1 in series to prepare an element;
   electrically connecting a plurality of elements in parallel to prepare a unit; and
   electrically connecting a plurality of units in series to prepare the thermoelectric module.

9. A method of preparing a thermoelectric module, comprising:
   electrically connecting a plurality of a thermoelectric materials prepared by the method of claim 1 in parallel to prepare an element;
   electrically connecting a plurality of elements in series to prepare a unit; and
   electrically connecting a plurality of units in parallel to prepare the thermoelectric module.

* * * * *

UNITED STATES PATENT AND TRADEMARK OFFICE
CERTIFICATE OF CORRECTION

PATENT NO. : 10,418,538 B2  
APPLICATION NO. : 15/440511  
DATED : September 17, 2019  
INVENTOR(S) : Masakazu Mukaida et al.

Page 1 of 1

It is certified that error appears in the above-identified patent and that said Letters Patent is hereby corrected as shown below:

In the Specification

In Column 3, Line 26, delete "qz" and insert -- $q_z$ --.

Signed and Sealed this  
Twenty-fifth Day of February, 2020

Andrei Iancu  
*Director of the United States Patent and Trademark Office*

UNITED STATES PATENT AND TRADEMARK OFFICE
CERTIFICATE OF CORRECTION

PATENT NO. : 10,418,538 B2  
APPLICATION NO. : 15/440511  
DATED : September 17, 2019  
INVENTOR(S) : Masakazu Mukaida et al.

It is certified that error appears in the above-identified patent and that said Letters Patent is hereby corrected as shown below:

In the Drawings

In sheet 36 of 36, FIG. 20, x-axis Line 1, delete "Anneling" and insert --Annealing--.

In the Specification

In Column 5, Line 59, delete "cupper," and insert --copper,--.

In Column 6, Line 25 approx., delete "pk/V," and insert --µk/V,--.

In Column 7, Line 17, delete "pV/K)." and insert --µV/K).--.

In Column 8, Line 22, delete "n-conjugated" and insert --π-conjugated--.

In Column 8, Line 39, delete "forma" and insert --form a--.

In Column 14, Line 44, delete "cupper" and insert --copper--.

In Column 14, Line 50, delete "the a" and insert --the--.

Signed and Sealed this  
Seventeenth Day of March, 2020

Andrei Iancu  
*Director of the United States Patent and Trademark Office*